(12) United States Patent
Kim et al.

(10) Patent No.: US 9,570,132 B2
(45) Date of Patent: Feb. 14, 2017

(54) ADDRESS-REMAPPED MEMORY CHIP, MEMORY MODULE AND MEMORY SYSTEM INCLUDING THE SAME

(71) Applicant: Samsung Electronics Co., Ltd., Suwon-si (KR)

(72) Inventors: Cheol Kim, Seoul (KR); Young-soo Sohn, Seoul (KR); Sang-Ho Shin, Yongin-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/803,119

(22) Filed: Jul. 20, 2015

(65) Prior Publication Data
US 2016/0148656 A1    May 26, 2016

(30) Foreign Application Priority Data
Nov. 21, 2014   (KR) ................. 10-2014-0163217

(51) Int. Cl.
| | |
|---|---|
| *G11C 8/00* | (2006.01) |
| *G11C 8/06* | (2006.01) |
| *H01L 25/065* | (2006.01) |
| *G11C 29/00* | (2006.01) |

(52) U.S. Cl.
CPC ............. *G11C 8/06* (2013.01); *G11C 29/76* (2013.01); *G11C 29/785* (2013.01); *H01L 25/0657* (2013.01); *H01L 2225/06506* (2013.01); *H01L 2225/06527* (2013.01); *H01L 2924/0002* (2013.01)

(58) Field of Classification Search
CPC ....... G11C 17/16; G11C 17/18; G11C 29/027; H01L 2924/00
USPC ............................................... 365/51, 230.01
See application file for complete search history.

(56) References Cited

U.S. PATENT DOCUMENTS

| | | | |
|---|---|---|---|
| 5,109,360 | A | 4/1992 | Inazumi et al. |
| 7,277,337 | B1 | 10/2007 | Co et al. |
| 7,352,621 | B2 | 4/2008 | Rothman et al. |

(Continued)

FOREIGN PATENT DOCUMENTS

| | | |
|---|---|---|
| JP | 1999-306791 | 11/1999 |
| KR | 10-0336434 | 5/2002 |
| KR | 10-0533377 | 1/2006 |

*Primary Examiner* — Anthan Tran
(74) *Attorney, Agent, or Firm* — Muir Patent Law, PLLC

(57) ABSTRACT

A memory chip includes a chip input-output pad unit, a plurality of semiconductor dies. The chip input-output pad unit includes a plurality of input-output pins connected to an external device and the plurality of semiconductor dies are connected commonly to the chip input-output pad unit and having a full memory capacity respectively. Each semiconductor die includes a die input-output pad unit, a memory region and a conversion block. The die input-output pad unit includes a plurality of input-output terminals respectively connected to the input-output pins of the chip input-output pad unit. The memory region includes an activated region corresponding to a portion of the full memory capacity and a deactivated region corresponding to a remainder portion of the full memory capacity. The conversion block connects the activated region except the deactivated region to the die input-output pad unit.

20 Claims, 19 Drawing Sheets

(56) References Cited

U.S. PATENT DOCUMENTS

| | | | |
|---|---|---|---|
| 7,359,264 B2 | 4/2008 | Kim et al. | |
| 7,859,933 B2 | 12/2010 | Yoshida et al. | |
| 7,916,540 B2 | 3/2011 | Byeon | |
| 8,015,346 B2 | 9/2011 | Chen et al. | |
| 2006/0156089 A1* | 7/2006 | Yang | G11C 29/76 |
| | | | 714/718 |
| 2006/0176740 A1* | 8/2006 | Kim | G11C 29/021 |
| | | | 365/185.33 |
| 2007/0109887 A1* | 5/2007 | Baker | G11C 29/40 |
| | | | 365/201 |
| 2009/0196116 A1* | 8/2009 | Oh | G11C 8/12 |
| | | | 365/230.03 |
| 2010/0177572 A1* | 7/2010 | Lee | G11C 5/00 |
| | | | 365/189.05 |
| 2013/0166944 A1* | 6/2013 | Park | G11C 29/802 |
| | | | 714/6.3 |

\* cited by examiner

| MEMORY CAPACITY | CONNECTED FUSE | | CUT FUSE | |
|---|---|---|---|---|
| FULL | F1,F3 | | F2,F4,F5 | |
| HALF | F2 | F4 | F1,F3 | F5 |
| | | F5 | | F4 |

FIG. 8
| CASE | CS | An | CSp | CSq |
|------|----|----|-----|-----|
| 1 | H | H | H | H |
| 2 | H | L | H | H |
| 3 | L | H | L | H |
| 4 | L | L | H | L |
FIG. 9
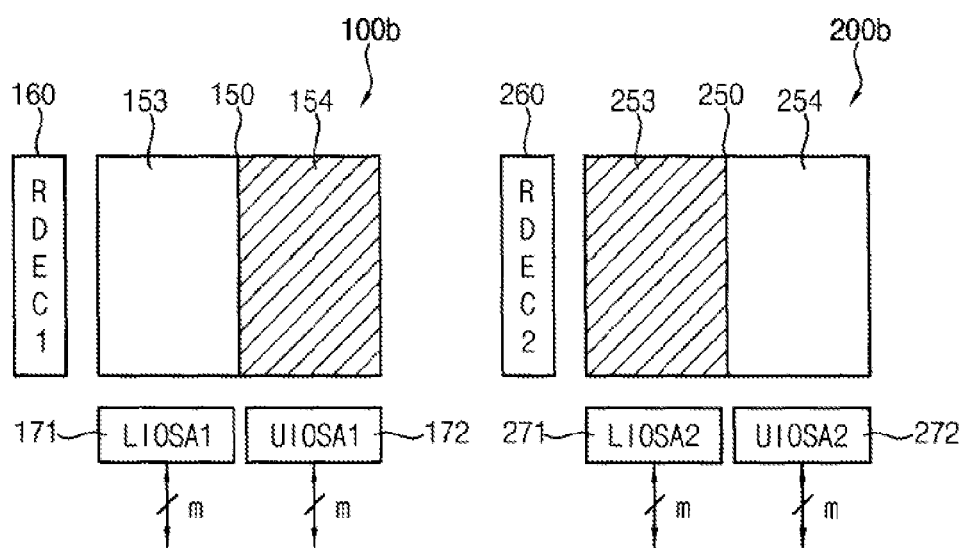

| BA0 | BA1 | DC0p | DC1p | DC2p | DC3p | MP0p | MP1p | MP2p | MP3p | DPSp |
|-----|-----|------|------|------|------|------|------|------|------|------|
| L | L | H | L | L | L | L | L | L | H | L |
| L | H | L | H | L | L | L | H | L | L | H |
| H | L | L | L | H | L | L | L | H | L | H |
| H | H | L | L | L | H | L | L | L | H | H |

| BA0 | BA1 | DC0q | DC1q | DC2q | DC3q | MP0q | MP1q | MP2q | MP3q | DPSq |
|---|---|---|---|---|---|---|---|---|---|---|
| L | L | H | L | L | L | L | L | H | L | L |
| L | H | L | H | L | L | L | L | L | H | L |
| H | L | L | L | H | L | H | L | L | L | H |
| H | H | L | L | L | H | L | H | L | L | H |

ADDRESS-REMAPPED MEMORY CHIP, MEMORY MODULE AND MEMORY SYSTEM INCLUDING THE SAME

CROSS-REFERENCE TO RELATED APPLICATION

This U.S. Non-provisional application claims priority under 35 USC §119 to Korean Patent Application No. 10-2014-0163217, filed on Nov. 21, 2014, in the Korean Intellectual Property Office (KIPO), the disclosure of which is incorporated by reference in its entirety herein.

BACKGROUND

The present disclosure relates generally to semiconductor integrated circuits, and more particularly to an address-remapped memory chip, a memory module and a memory system including the memory chip.

A memory device may not perform its function and may need to be discarded as a failed device if even one memory cell is defective. In general, the memory device may include redundant memory cells to replace the defective or failed cells. A repair operation may be performed to replace the failed memory cells with redundant memory cells and thus to enhance yield of memory devices.

The number of the redundant memory cells is typically limited because the redundant memory cells lower integration degree of the memory device. In general, if the number of the failed memory cells exceeds the number of redundant memory cells, the entire memory device has to be discarded even though the number of the normally-operating memory cells is considerable and thus productivity is limited.

SUMMARY

Example embodiments of the inventive concept may provide a memory chip capable of reusing incurable semiconductor dies.

Example embodiments of the inventive concept may provide a memory module including a memory chip capable of reusing incurable semiconductor dies.

Example embodiments of the inventive concept may provide a memory system including a memory chip capable of reusing incurable semiconductor dies.

According to example embodiments, a memory chip may include a chip input-output pad unit, a plurality of semiconductor dies. The chip input-output pad unit includes a plurality of input-output pins connected to an external device and the plurality of semiconductor dies are connected commonly to the chip input-output pad unit and having a full memory capacity respectively. Each semiconductor die includes a die input-output pad unit, a memory region and a conversion block. The die input-output pad unit includes a plurality of input-output terminals respectively connected to the input-output pins of the chip input-output pad unit. The memory region includes an activated region corresponding to a portion of the full memory capacity and a deactivated region corresponding to a remainder portion of the full memory capacity. The conversion block connects the activated region, except the deactivated region, to the die input-output pad unit.

The conversion block may include a plurality of fuses and the plurality of fuses are programmed based on a location of the activated region before the memory chip is packed.

A sum of memory capacities of the activated regions of the plurality of the semiconductor dies may be equal to the full memory capacity of each semiconductor die.

The plurality of semiconductor dies may include a first semiconductor die and a second semiconductor die that are stacked vertically and packaged together.

Each of the activated region of the first semiconductor die and the activated region of the second semiconductor die may be one of a first region corresponding to a logic high level of a most significant address bit signal and a second region corresponding to a logic low level of the most significant address bit signal.

The conversion block may include an address conversion block configured to generate an internal chip select signal and an internal most significant address bit signal corresponding to the activated region based on a chip select signal and the most significant address bit signal that are received through the chip input-output pad unit and the die input-output pad unit.

When the chip select signal is activated, one of the internal chip select signal of the first semiconductor die and the internal chip select signal of the second semiconductor die may be activated selectively depending on the logic high level or the logic low level of the most significant address bit signal.

Each of the internal most significant address bit signal of the first semiconductor die and the internal most significant address bit signal of the second semiconductor die may be fixed to the logic high level or the logic low level depending on location of each activated region regardless of the logic level of the most significant address bit signal.

The address conversion block may include a logic gate and a fuse unit. The logic gate is configured to perform a logic operation on the chip select signal and the most significant address bit signal. The fuse unit configured to output one of the chip select signal and an output of the logic gate as the internal chip select signal and further configured to output one of the most significant address bit signal and a signal having a fixed logic level as the internal most significant address bit signal.

One of the die input-output pad unit of the first semiconductor die and the die input-output pad unit of the second semiconductor die may send data to and receive data from the chip input-output pad unit with full data width of the memory chip.

Each memory capacity of the activated region of the first semiconductor die and the activated region of the second semiconductor die may be equal to a half of the full memory capacity of each semiconductor die.

Each of the activated region of the first semiconductor die and the activated region of the second semiconductor die may be one of a first region to which a lower input-output sense amplifier is designated and a second region to which an upper input-output sense amplifier is designated.

The conversion block may include a data path conversion block configured to connect one sense amplifier designated to the activated region among the lower input-output sense amplifier and the upper input-output sense amplifier to one of lower data terminals and upper data terminals included in the die input-output pad unit.

The data path conversion block may include a first fuse array coupled between the lower input-output sense amplifier and first nodes, a second fuse array coupled between the upper input-output sense amplifier and second nodes, a third fuse array coupled between the first nodes and the lower data terminals, a fourth fuse array coupled between the second nodes and the upper data terminals, and a fifth fuse array coupled between the first nodes and the second nodes.

One of the fuse array and the second fuse array may be cut selectively, and one of the third fuse array and the fourth fuse array may be cut selectively.

The die input-output pad unit of the first semiconductor die may exchange data with the chip input-output pad unit at a first half of data width of the memory chip and the die input-output pad unit of the second semiconductor die may exchange data with the chip input-output pad unit at a second half of data width of the memory chip.

The memory region may include a plurality of memory banks and each memory bank may have a split-bank structure such that each memory bank is divided into a lower sub memory bank to which a lower input-output sense amplifier is designated and an upper sub memory bank to which an upper input-output sense amplifier is designated. Each of the activated region of the first semiconductor die and the activated region of the second semiconductor die may correspond to a half of the lower sub memory banks and the upper sub memory banks.

The conversion block may include a bank address conversion block and a data path conversion block. The bank address conversion block is configured to generate bank select signals and a data path select signal corresponding to the activated region based on at least one bank address bit signal that is received through the chip input-output pad unit and the die input-output pad unit. The data path conversion block is configured to connect one sense amplifier corresponding to the activated region among the lower input-output sense amplifier and the upper input-output sense amplifier to one of lower data terminals and upper data terminals included in the die input-output pad unit, in response to the data path select signal.

According to example embodiments, a memory module includes a module board and a plurality of memory chips stacked on the module board. At least one of the plurality of memory chips includes a chip input-output pad unit including a plurality of input-output pins connected to an external device and a plurality of semiconductor dies connected to the chip input-output pad unit and having a full memory capacity respectively. Each semiconductor die includes a die input-output pad unit including a plurality of input-output terminals respectively connected to the input-output pins of the chip input-output pad unit, a memory region including an activated region corresponding to a portion of the full memory capacity and a deactivated region corresponding to a remainder portion of the full memory capacity and a conversion block configured to connect the activated region, except the deactivated region, to the die input-output pad unit.

According to example embodiments, a memory system includes a memory controller and at least one memory chip connected to the memory controller. The at least one memory chip includes a chip input-output pad unit including a plurality of input-output pins connected to an external device and a plurality of semiconductor dies connected commonly to the chip input-output pad unit and having a full memory capacity respectively. Each semiconductor die includes a die input-output pad unit including a plurality of input-output terminals respectively connected to the input-output pins of the chip input-output pad unit, a memory region including an activated region corresponding to a portion of the full memory capacity and a deactivated region corresponding to a remainder portion of the full memory capacity and a conversion block configured to connect the activated region except the deactivated region to the die input-output pad unit.

As such, the memory chip according to example embodiment may enhance productivity by reusing incurable semiconductor dies. The incurable semiconductor dies may be stacked to have the same memory capacity as a full memory capacity of a normal semiconductor die and thus productivity may be enhanced without increasing sizes of a memory chip.

BRIEF DESCRIPTION OF THE DRAWINGS

Example embodiments of the inventive concept will be more clearly understood from the following detailed description referring to the accompanying drawings.

FIG. 8 is a diagram illustrating operations of the address conversion blocks of FIGS. 5 and 6, according to example embodiments.

FIG. 9 is a diagram illustrating an example of activated and deactivated regions of semiconductor dies.

DETAILED DESCRIPTION

Figure 1:
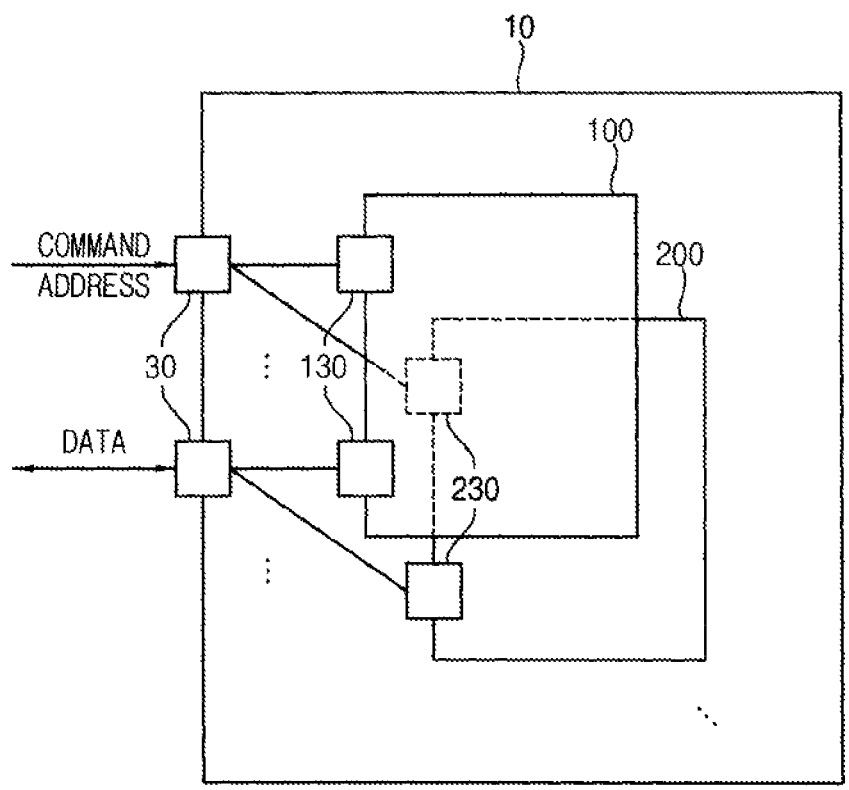
FIG. 1 is a diagram illustrating a memory chip according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Though these terms may indicate substantive features, such as an order, or a positioning, based on their context, in general, these terms are used simply to distinguish one element from another. Thus, a first element discussed in one portion of the specification could be termed a second element in another portion of the specification or in the claims without departing from the teachings of the present inventive concept. In some cases, terms such as "first" and "second," etc., may be used in the claims in connection with elements that are not described using such descriptors in the specification. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a memory chip according to example embodiments.

Referring to FIG. 1, a memory chip 10 includes a chip input-output pad unit 30 and a plurality of semiconductor dies 100 and 200. The two semiconductor dies 100 and 200 are illustrated in FIG. 1 for convenience of illustration and three or more semiconductor dies may be packaged together in the same memory chip 10. The two semiconductor dies 100 and 200 may form a semiconductor device. As described herein, a "semiconductor device" may refer to a single die or semiconductor chip, a plurality of dies or semiconductor chips, a semiconductor package including one or more semiconductor dies or semiconductor chips disposed on a package substrate, or a package-on-package device. A semiconductor chip refers to a single die including an integrated circuit, whereas a chip or memory chip may refer to one or more dies, as described in connection with the various figures described herein.

The chip input-output pad unit 30 includes a plurality of input-output pins connected to an external device. The input-output pins may include a command-address pins receiving commands and addresses from the external device and data pins for exchanging data with the external device. The command-address pins may include pins for receiving a chip select signal, a row access strobe (RAS) signal, a column access strobe (CAS) signal, a write enable signal, etc. The numbers and kinds of the command-address pins and the data pins may be varied according to the kind and configuration of the memory integrated in the semiconductor die.

The semiconductor dies 100 and 200 are connected commonly to the chip input-output pad unit 30 and have a full memory capacity respectively. The semiconductor dies 100 and 200 may include die input-output pad units 130 and 230, respectively.

Figure 2:
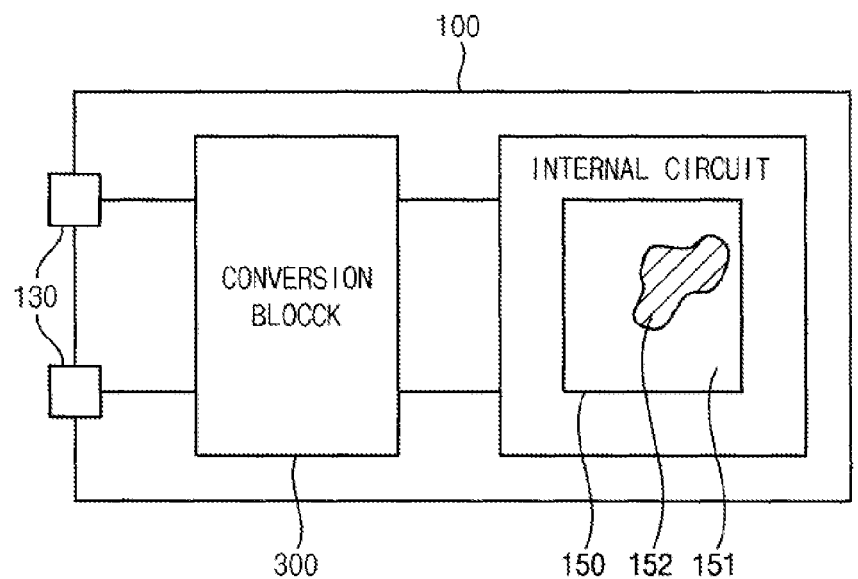
FIG. 2 is a diagram illustrating one semiconductor die included in the memory chip of FIG. 1, according to example embodiments.

FIG. 2 is a diagram illustrating one semiconductor die included in the memory chip of FIG. 1.

FIG. 2 illustrates a schematic configuration of the one semiconductor die 100 for convenience of illustration and the other semiconductor dies in the memory chip 10 of FIG. 1 may have the same as or similar to the configuration illustrated in FIG. 2.

Referring to FIG. 2, the semiconductor die 100 may include a die input-output pad unit 130, a memory region 150 and a conversion block 300.

The die input-output pad unit 130 may include a plurality of input-output terminals respectively connected to the input-output pins of the chip input-output pad unit 30 in FIG. 1. As described below with reference to FIG. 4, the die input-output pad unit 130 may include command-address terminals connected to the command-address pins in the chip input-output pad unit 30 and data terminals connected to the data pins in the chip input-output pad unit 30.

The memory region 150 may include an activated region 151 corresponding to a portion of the full memory capacity and a deactivated region 152 corresponding to a remainder portion of the full memory capacity. The activated region 151 and the deactivated region 152 may be determined through a wafer test before the semiconductor die 100 is packaged as a chip. For example, if there are too many failed memory cells to be repairable using the redundant memory cells and/or there exist a failed region where the failed memory cells are concentrated, the deactivated region 152 may be set to include the failed region.

As will be described below in this disclosure, the activated region 151 and the deactivated region 152 may be determined variously, for example, based on row units, column units, memory bank units, sub memory bank units, etc.

The conversion block 300 may connect the activated region 151 except the deactivated region 152 to the die input-output pad unit 130. For example, the conversion block 300 may perform an address remapping operation so that only the activated region 151 may be accessed. According to example embodiments, the conversion block 300 may be implemented as hardware to perform the address remapping operation. For example, the conversion block 300 may include a plurality of fuses and the plurality of fuses may be programmed based on a location of the activated region 151 before the memory chip 10 is packed.

A sum of memory capacities of the activated regions of the semiconductor dies in the memory chip 10 may be equal to the full memory capacity of each semiconductor die. For example, the memory chip 10 may include the first semiconductor die 100 and the second semiconductor die 200. If the full memory capacity of each of the semiconductor dies 100 and 200 is 4 Giga bits (Gb), each of the activated regions in the first and second semiconductor dies 100 and 200 may be 2 Gb, respectively.

As such, the memory chip 10 according to example embodiment may enhance productivity by reusing incurable semiconductor dies that cannot be repaired using the redundant memory cells. In addition, the incurable semiconductor dies may be stacked to have the same memory capacity as the full memory capacity of a normal semiconductor die and thus productivity may be enhanced without increasing sizes of a memory chip.

Figure 3:
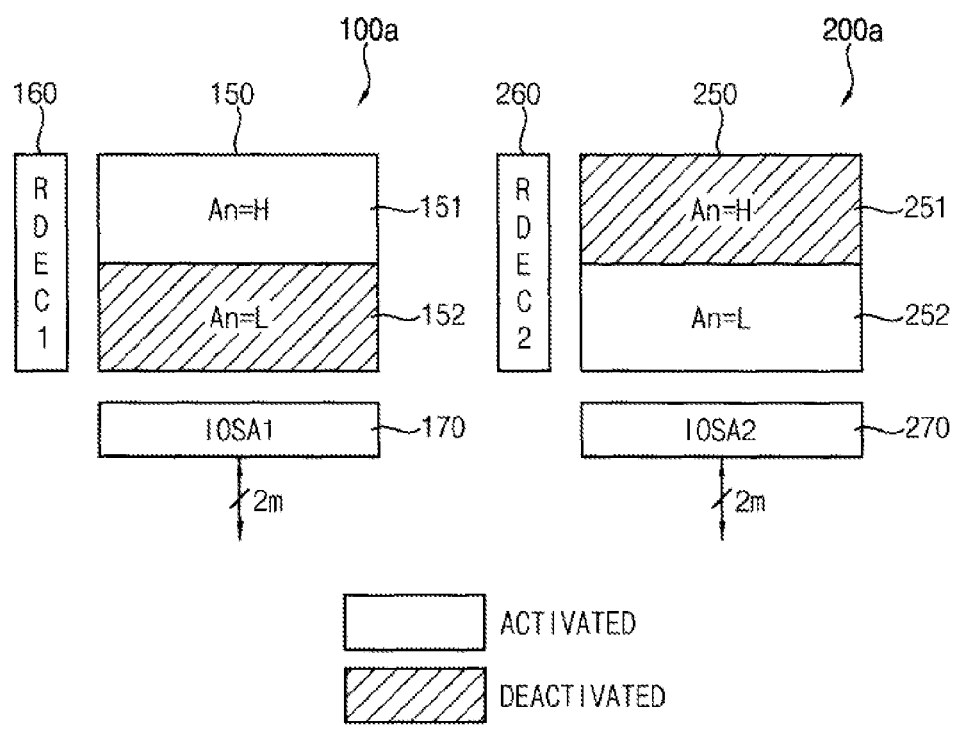
FIG. 3 is a diagram illustrating an example of activated and deactivated regions of semiconductor dies.

FIG. 3 is a diagram illustrating an example of activated and deactivated regions of semiconductor dies.

FIG. 3 illustrates memory regions 150 and 250, row decoders RDEC1 160 and RDEC2 260 and input-output sense amplifiers IOSA1 170 and IOSA2 270 included in a first semiconductor die 100a and a second semiconductor die 200a, respectively. In FIG. 3, hashed portions represent the deactivated regions and not-hashed regions represent the activated regions.

Referring to FIG. 3, each of the activated region of the first semiconductor die 100a and the activated region of the second semiconductor die 200a may be one of a first region corresponding to a logic high level H of a most significant address bit signal An and a second region corresponding to a logic low level L of the most significant address bit signal An. For example, the first region may be a region that is accessed when the most significant address bit signal An is the logic high level H and the second region may be a region that is accessed when the most significant address bit signal An is the logic low level L.

For example, as illustrated in FIG. 3, the first region 151 may correspond to the activated region and the second region 152 may correspond to the deactivated region in the case of the first semiconductor die 100a whereas the first region 251 may correspond to the deactivated region and the second region 252 may correspond to the activated region in the case of the second semiconductor die 200a. As a result, each memory capacity of the activated region 151 of the first semiconductor die 100a and the activated region 252 of the second semiconductor die 200a may be equal to a half of the full memory capacity of each of the semiconductor dies 100a and 200a. As such, the memory chip having the full memory capacity may be implemented using the two failed semiconductor dies 100a and 200a having the half of the full capacity of the memory chip.

If the semiconductor dies are normal semiconductor dies that do not include the deactivated regions or the failed regions, each of the semiconductor dies may exchange data with the external device at a maximum data width, for example, of $2m$. If the memory chip having the full memory capacity is implemented using the two semiconductor dies 100a and 200a having the half memory capacity as illustrated in FIG. 3, the two semiconductor die 100a and 200a are not accessed simultaneously, but one semiconductor die is accessed selectively. In this case, one of the die input-output pad unit of the first semiconductor die 100a and the first die input-output pad unit of the second semiconductor die 200a may exchange data with the chip input-output pad unit 30 at the maximum data width $2m$, as described below.

Figure 4:
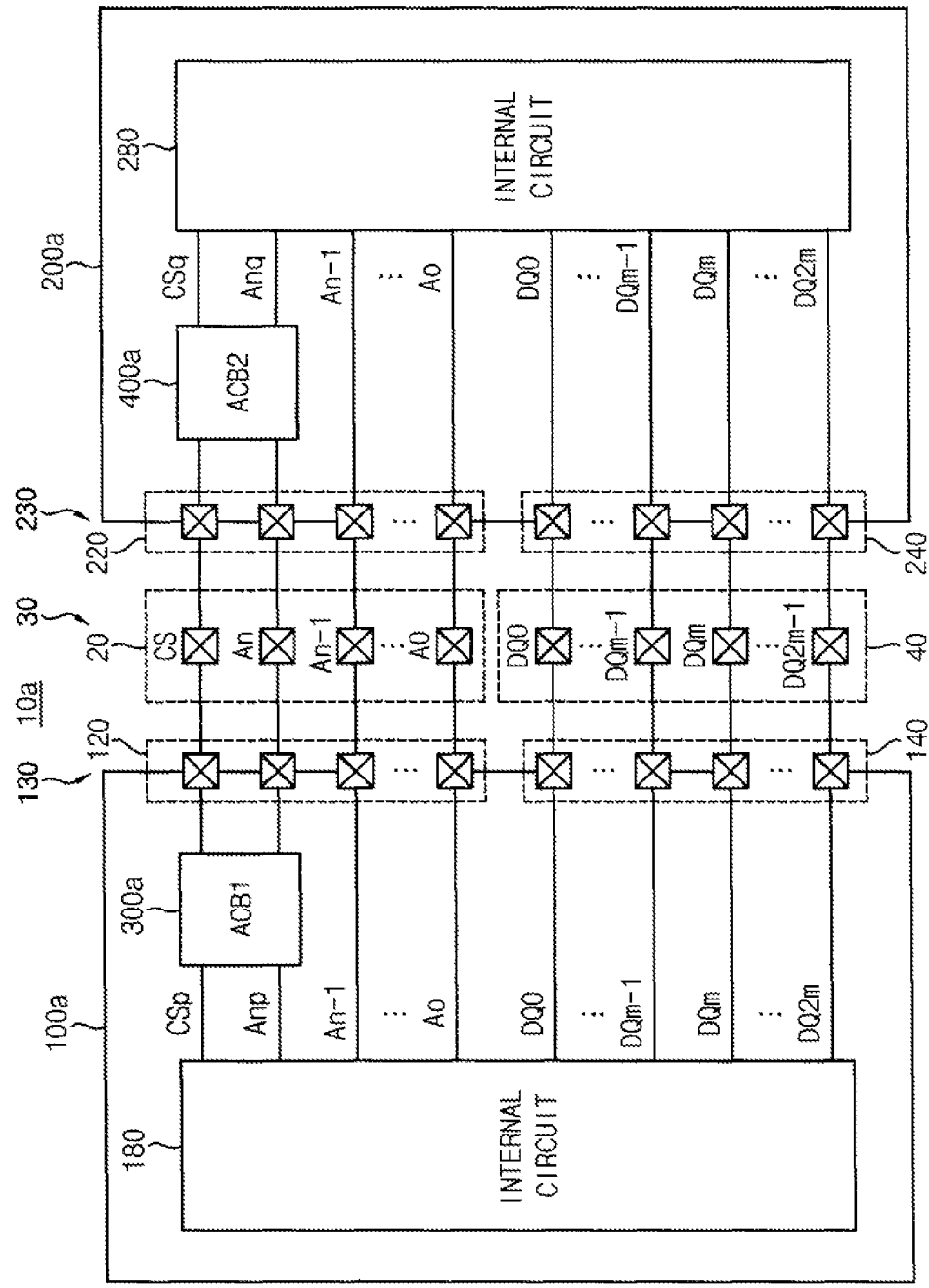
FIG. 4 is a block diagram illustrating a memory chip according to example embodiments.

FIG. 4 is a block diagram illustrating a memory chip according to example embodiments.

Referring to FIG. 4, a memory chip 10a may include a chip input-output pad unit 30, a first semiconductor die 100a and a second semiconductor die 200a. The first semiconductor die 100a may include a first die input-output pad unit 130, a first address conversion block ACB1 300a and a first internal circuit 180. The second semiconductor die 200a may include a second die input-output pad unit 230, a second address conversion block ACB2 400a and a second internal circuit 280. The first address conversion block 300a and the second address conversion block 400a correspond to the above mentioned conversion block. The internal circuits 180 and 280 may include the memory regions, the row decoders, the input-output sense amplifiers, etc., respectively.

The chip input-output pad unit 30 may include command-address pins 20 receiving command-address signals CS and A0~An and data pins 40 transferring data signals DQ0~DQ2$m$−1. The first and second die input-output pad units 130 and 230 may include command-address terminals 120 and 220 connected to the command-address pins 20 and data terminals 140 and 240 connected to the data pins 40, respectively. FIG. 4 illustrates the input-output pins and the corresponding input-output terminals for describing the example embodiments and the other pins and the corresponding terminals are omitted for convenience of illustration.

Each of the first address conversion block 300a and the second address conversion block 400a may generate an internal chip select signal and an internal most significant address bit signal corresponding to the activated region based on a chip select signal CS and the most significant address bit signal An that are received through the chip input-output pad unit 30 and each of the die input-output pad units 130 and 230.

The first address conversion block 300a may generate a first internal chip select signal CSp and a first internal most significant address bit signal Anp corresponding to the activated region, which is set in the memory region of the first internal circuit 180, based on the chip select signal CS and the most significant address bit signal An that are received through the chip input-output pad unit 30 and the first die input-output pad unit 130. The second address conversion block 400*a* may generate a second internal chip select signal CSq and a second internal most significant address bit signal Anq corresponding to the activated region, which is set in the memory region of the second internal circuit 280, based on the chip select signal CS and the most significant address bit signal An that are received through the chip input-output pad unit 30 and the second die input-output pad unit 230.

The other address bit signals A0~An−1 and the data signals DQ0~DQ2m−1 may be transferred to the internal circuits 180 and 280 without conversion through the address-command terminals 120 and 220 and the data terminals 140 and 240.

Figure 5:
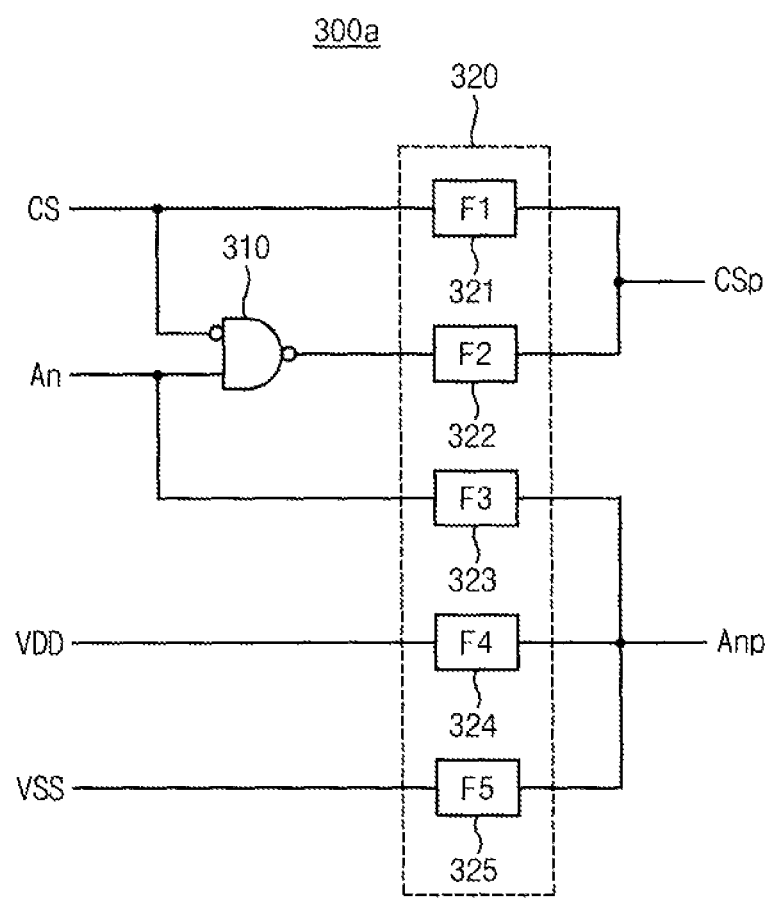
FIG. 5 is a diagram illustrating an example embodiment of a first address conversion block included in the memory chip of FIG. 4, according to example embodiments.

FIG. 5 is a diagram illustrating an example embodiment of a first address conversion block included in the memory chip of FIG. 4.

Referring to FIG. 5, the first address conversion block 300*a* may include a logic gate 310 and a fuse unit 320. The logic gate 310 may perform a logic operation on the chip select signal CS and the most significant address bit signal An. For example, as illustrated in FIG. 5, the logic gate 310 may perform a NAND logic operation on an inversion signal of the chip select signal CS and the most significant address bit signal An. The fuse unit 320 may output one of the chip select signal CS and an output of the logic gate 310 as the first internal chip select signal CSp. In addition, the fuse unit 320 may output one of the most significant address bit signal An and a signal having a fixed logic level as the first internal most significant address bit signal Anp.

The fuse unit 320 may include a plurality of fuses F1~F5 321~325. One of the chip select signal CS and the output of the logic gate 310 may be output as the first internal chip select signal CSp by electrically connecting one of the two fuses 321 and 322 and cutting the other fuse. In addition, one of the most significant address bit signal An and the signal having the fixed logic level may be output as the first internal most significant address bit signal Anp by electrically connecting one of the three fuses 323, 324 and 325 and cutting the other fuses. As illustrated in FIG. 5, the fixed logic level may be the logic high level H corresponding to a power supply voltage VDD or the logic low level corresponding to a ground voltage VSS.

Figures 6, 7:
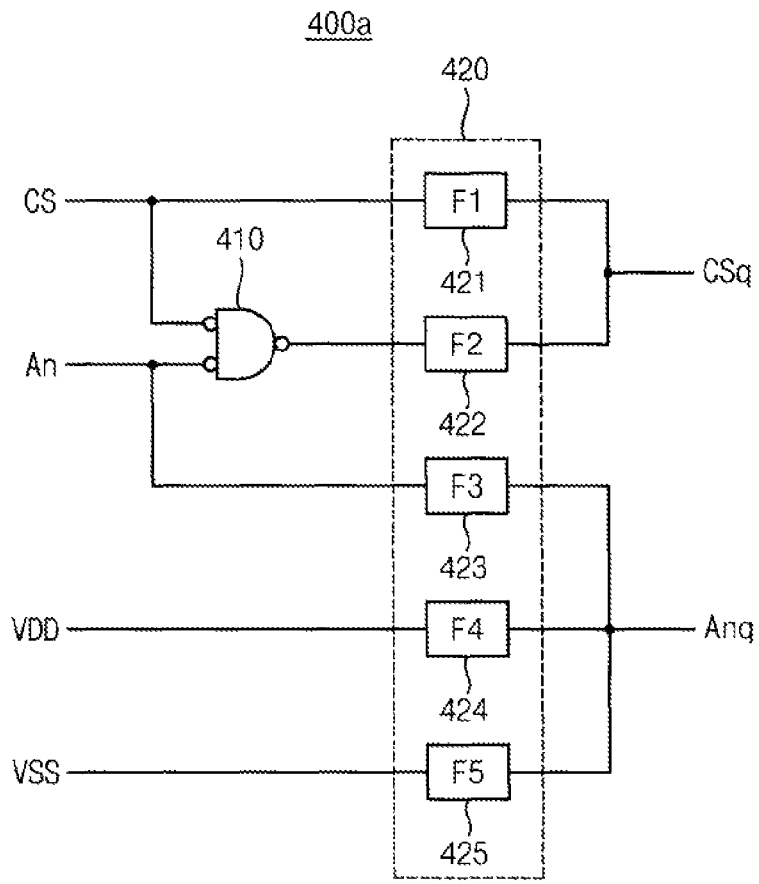
FIG. 6 is a diagram illustrating an example embodiment of a second address conversion block included in the memory chip of FIG. 4, according to example embodiments.
FIG. 7 is a diagram for describing fuse setting of the address conversion blocks of FIGS. 5 and 6, according to example embodiments.

FIG. 6 is a diagram illustrating an example embodiment of a second address conversion block included in the memory chip of FIG. 4.

Referring to FIG. 6, the second address conversion block 400*a* may include a logic gate 410 and a fuse unit 420. The logic gate 410 may perform a logic operation on the chip select signal CS and the most significant address bit signal An. For example, as illustrated in FIG. 6, the logic gate 410 may perform a NAND logic operation on an inversion signal of the chip select signal CS and an inversion signal of the most significant address bit signal An. The fuse unit 420 may output one of the chip select signal CS and an output of the logic gate 420 as the second internal chip select signal CSq. In addition, the fuse unit 420 may output one of the most significant address bit signal An and a signal having a fixed logic level as the second internal most significant address bit signal Anq.

The fuse unit 420 may include a plurality of fuses F1~F5 421~425. One of the chip select signal CS and the output of the logic gate 410 may be output as the second internal chip select signal CSq by electrically connecting one of the two fuses 421 and 422 and cutting the other fuse. In addition, one of the most significant address bit signal An and the signal having the fixed logic level may be output as the second internal most significant address bit signal Anq by electrically connecting one of the three fuses 423, 424 and 425 and cutting the other fuses. As illustrated in FIG. 6, the fixed logic level may be the logic high level H corresponding to a power supply voltage VDD or the logic low level corresponding to a ground voltage VSS.

The fuses F1~F5 in FIGS. 5 and 6 may be electrical fuses, anti-fuses or a combination of the electrical fuses and the anti-fuses. The electrical fuse may be connected initially and may be programmed or cut electrically by applying a high voltage or a high current. The anti-fuse may be a MOS capacitor that is cut initially and may be programmed or connected electrically by applying a high voltage. The electrical fuse and the anti-fuse are one time programmable (OTP) memory elements that cannot be recovered once they are programmed. The fuses F1~F5 may be programmed based on the location of the activated region before the memory chip is packaged.

FIG. 7 is a diagram for describing fuse setting of the address conversion blocks of FIGS. 5 and 6.

Referring to FIGS. 5, 6 and 7, the fuses may be set or programmed depending on whether the semiconductor die is a normal semiconductor die having the full memory capacity or the failed semiconductor die having the half memory capacity.

In the case of the normal semiconductor die having the full memory capacity, the first and third fuses F1 and F3 may be electrically connected and the second, fourth and fifth fuses F2, F4 and F5 may be cut in FIGS. 5 and 6. Through such fuse setting, the chip select signal CS and the most significant address bit signal An as they are may be provided as the internal chip select signals CSp and CSq and the internal most significant address bit signals Anp and Anq. The one normal semiconductor die may be packaged to provide a memory chip having the full memory capacity.

In the case of the failed semiconductor die having the half memory capacity, the second fuse F2 may be electrically connected and the first and third fuses F1 and F3 may be cut in FIGS. 5 and 6. One of the fourth and fifth fuses F4 and F5 may be electrically connected and the other may be cut.

For example, if the fourth fuse F4 is electrically connected and the fifth fuse F5 is cut in FIG. 5 or 6, the internal most significant address bit signal Anp or Anq may be fixed to the logic high level and thus the first region 151 or 251 in FIG. 3 may be accessed as the activated region. In contrast, if the fifth fuse F5 is electrically connected and the fourth fuse F4 is cut in FIG. 5 or 6, the internal most significant address bit signal Anp or Anq may be fixed to the logic low level and thus the second region 152 or 252 in FIG. 3 may be accessed as the activated region. Through such fuse setting, the chip select signal CS and the most significant address bit signal An may be converted or remapped to the internal chip select signals CSp and CSq and the internal most significant address bit signals Anp and Anq. The two failed semiconductor dies having the half memory capacity may be address-remapped and then may be packaged to provide a memory chip having the full memory capacity.

FIG. 8 is a diagram illustrating operations of the address conversion blocks of FIGS. 5 and 6.

FIG. 8 illustrates logic level of the signals when the first fuse F1 is cut and the second fuse F2 is electrically connected in FIGS. 5 and 6. The chip select signal CS and the internal chip select signals CSp and CSq may be low active signals and the most significant address bit signal may be a high active signal.

Referring to FIG. 8, when the chip select signal CS is deactivated in the logic high level, both of the first and second internal chip select signals CSp and CSq are deactivated in the logic high level regardless of the most significant address bit signal An. When the chip select signal CS is activated in the logic low level, one of the first and second internal chip select signal CSp and CSq is activated in the logic low level depending on the logic level of the most significant address bit signal An. Referring again to FIGS. 3 and 4, one of the first die input-output pad unit 130 of the first semiconductor die 100a and the second input-output pad unit 230 of the second semiconductor die 200a may exchange data with the chip input-output pad unit 30 at the maximum data width 2m of the memory chip 10a, through the selective activation of the semiconductor dies 100a and 200a.

As such, the failed semiconductor dies may be reused through such address-remapping and the memory chip having the full memory capacity may be provided without modification either in the interface between the memory chip and the external device or a memory controller.

FIG. 9 is a diagram illustrating an example of activated and deactivated regions of semiconductor dies.

FIG. 9 illustrates memory regions 150 and 250, row decoders RDEC1 160 and RDEC2 260 and lower input-output sense amplifiers LIOSA1 171 and LIOSA2 271, upper input-output sense amplifiers UIOSA1 172 and UIOSA2 272 included in a first semiconductor die 100b and a second semiconductor die 200b, respectively. In FIG. 9, hashed portions represent the deactivated regions and not-hashed regions represent the activated regions.

Referring to FIG. 9, each of the activated region of the first semiconductor die 100b and the activated region of the second semiconductor die 200b may be one of a first region corresponding to the lower input-output sense amplifier and a second region corresponding to the upper input-output sense amplifier. In other words, the first region may be a region that is accessed through the lower input-output sense amplifier 171 or 271 and the second region may be a region that is accessed through the upper input-output sense amplifier 172 or 272.

For example, as illustrated in FIG. 9, the first region 153 may correspond to the activated region and the second region 154 may correspond to the deactivated region in the case of the first semiconductor die 100b whereas the first region 253 may correspond to the deactivated region and the second region 254 may correspond to the activated region in the case of the second semiconductor die 200b. As a result, each memory capacity of the activated region 153 of the first semiconductor die 100b and the activated region 254 of the second semiconductor die 200b may be equal to a half of the full memory capacity of each of the semiconductor dies 100b and 200b. As such, the memory chip having the full memory capacity may be implemented using the two failed semiconductor dies 100b and 200b having the half memory capacity.

If the semiconductor dies are normal semiconductor dies that do not include the deactivated regions or the failed regions, each of the semiconductor dies may exchange data with the external device at a maximum data width 2m through each input-output sense amplifier. If the memory chip having the full memory capacity is implemented using the two semiconductor dies 100b and 200b having the half memory capacity as illustrated in FIG. 9, the two semiconductor dies 100b and 200b are accessed simultaneously and the maximum data width 2m is divided to the semiconductor dies 100b and 200b. In this case, the die input-output pad unit of the first semiconductor die 100b may exchange data with the chip input-output pad unit 30 at a first half m of data width 2m of the memory chip and the second die input-output pad unit of the second semiconductor die 200b may exchange data with the chip input-output pad unit 30 at a second half m of data width 2m of the memory chip, as described below.

Figure 10:
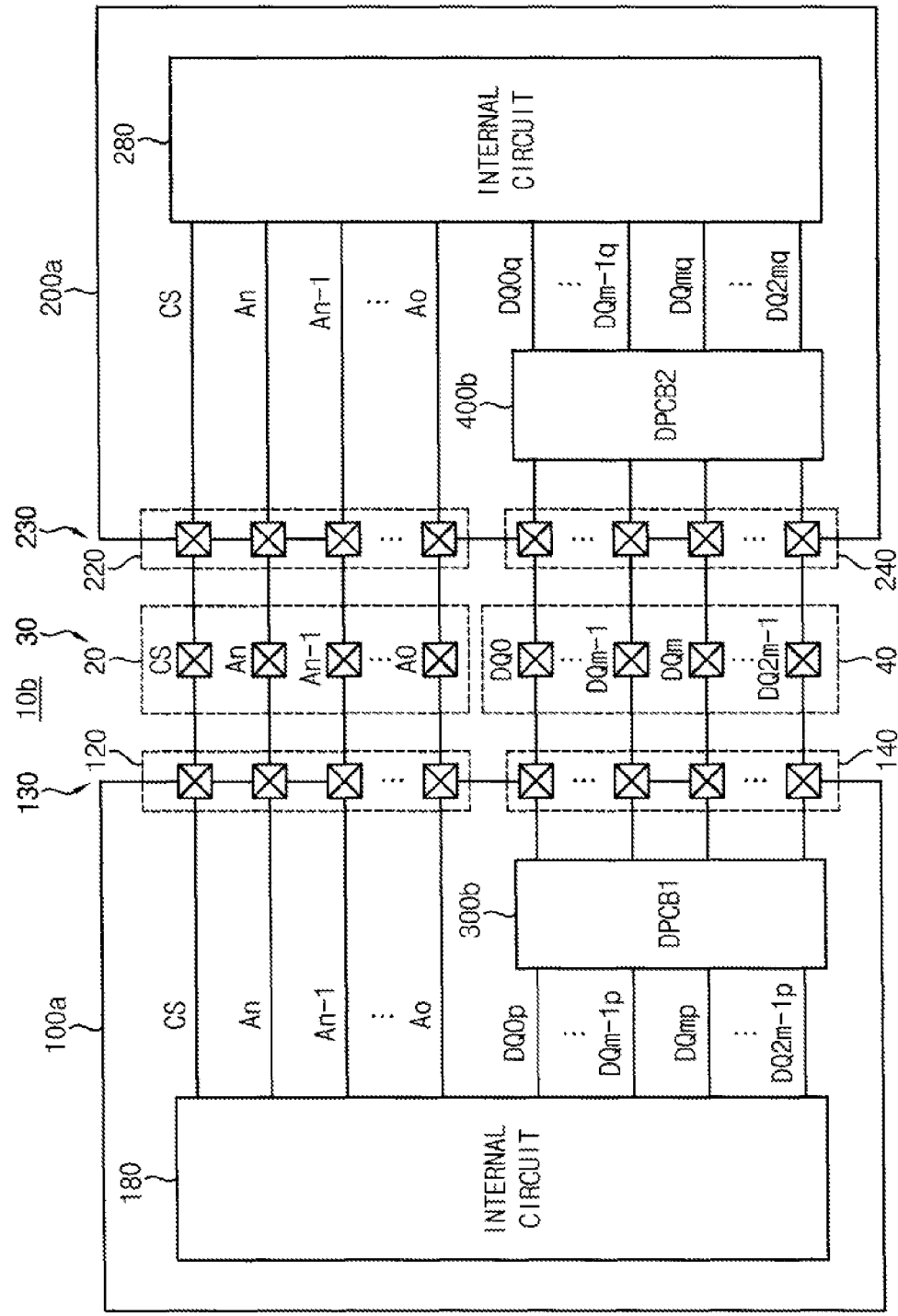
FIG. 10 is a block diagram illustrating a memory chip according to example embodiments.

FIG. 10 is a block diagram illustrating a memory chip according to example embodiments.

Referring to FIG. 10, a memory chip 10b may include a chip input-output pad unit 30, a first semiconductor die 100b and a second semiconductor die 200b. The first semiconductor die 100b may include a first die input-output pad unit 130, a first data path conversion block DPCB1 300b and a first internal circuit 180. The second semiconductor die 200b may include a second die input-output pad unit 230, a second data path conversion block DPCB2 400b and a second internal circuit 280. The first data path conversion block 300b and the second data path conversion block 400b correspond to the above mentioned conversion block. The internal circuits 180 and 280 may include the memory regions, the row decoders, the input-output sense amplifiers, etc., respectively.

The chip input-output pad unit 30 may include command-address pins 20 receiving command-address signals CS and A0~An and data pins 40 transferring data signals DQ0~DQ2m−1. The first and second die input-output pad units 130 and 230 may include command-address terminals 120 and 220 connected to the command-address pins 20 and data terminals 140 and 240 connected to the data pins 40, respectively. FIG. 10 illustrates the input-output pins and the corresponding input-output terminals for describing the example embodiments and the other pins and the corresponding terminals are omitted for convenience of illustration.

The first data path conversion block 300b and the second data path conversion block 400b may convert paths between the data signals DQ0~DQ2m−1 on the data pins 40 and first internal data signals DQ0p~DQ2m−1p and second internal data signals DQ0q~DQ2m−1q, respectively. When the semiconductor dies 100b and 200b have the half memory capacity as illustrated in FIG. 9, a half of the first internal data signals DQ0p~DQ2m−1p and a half of the second internal data signals DQ0q~DQ2m−1q correspond to the data signals DQ0~DQ2m−1 on the data pins 40.

The first data path conversion block 300b may connect one sense amplifier corresponding to the activated region among the lower input-output sense amplifier 171 and the upper input-output sense amplifier 172 in FIG. 9 to one of lower data terminals DQ0~DQm−1 and upper data terminals DQm~DQ2m−1 included in the first die input-output pad unit 130. The second data path conversion block 400b may connect one sense amplifier corresponding to the activated region among the lower input-output sense amplifier 271 and the upper input-output sense amplifier 272 in FIG. 9 to one of lower data terminals DQ0~DQm−1 and upper data terminals DQm~DQ2m−1 included in the second die input-output pad unit 230.

The chip select signal CS and the address bit signals A0~An may be transferred to the internal circuits 180 and 280 without conversion through the address-command terminals 120 and 220.

Figure 11:
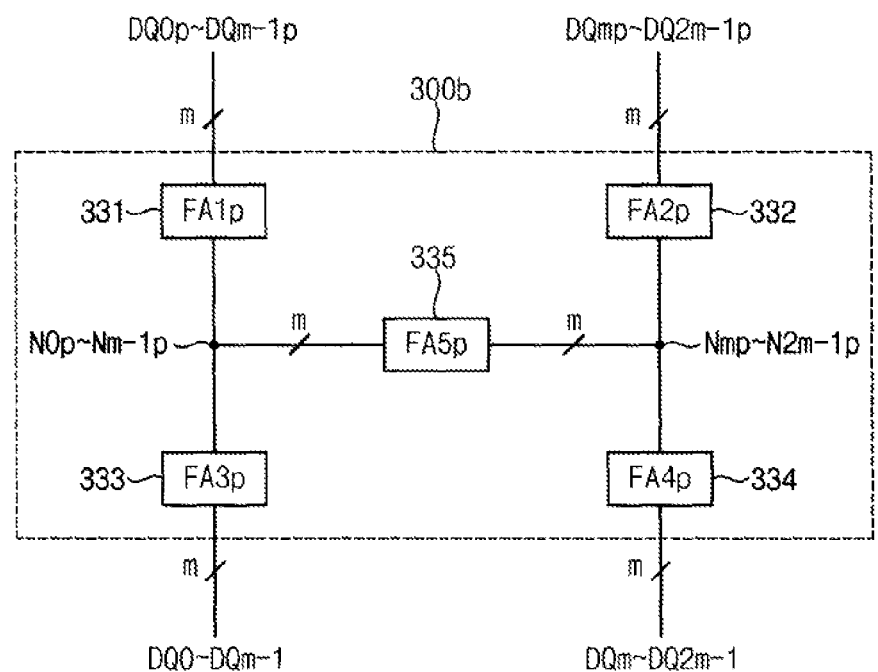
FIG. 11 is a diagram illustrating an example embodiment of a first data path conversion block included in the memory chip of FIG. 10.

FIG. 11 is a diagram illustrating an example embodiment of a first data path conversion block included in the memory chip of FIG. 10.

Referring to FIG. 11, the first data path conversion block 300b may include a first fuse array FA1p 331, a second fuse array FA2p 332, a third fuse array FA3p 333, a fourth fuse array FA4p 334 and a fifth fuse array FA5p 335.

The first fuse array 331 may be coupled between the lower input-output sense amplifier 171 in FIG. 9 and first nodes N0p~Nm-1p. The second fuse array 332 may be coupled between the upper input-output sense amplifier 172 in FIG. 9 and second nodes Nmp~N2m-1p. The third fuse array 333 may be coupled between the first nodes N0p~Nm-1p and the lower data terminals DQ0~DQm-1. The fourth fuse array 334 may be coupled between the second nodes Nmp~N2m-1p and the upper data terminals DQm~DQ2m-1. The fifth fuse array 335 may be coupled between the first nodes N0p~Nm-1p and the second nodes Nmp~N2m-1p.

Each of the fuse arrays 331~335 may include m fuses corresponding to a half of the data width 2m of the memory chip 10b. The connections between the lower and upper input-output sense amplifier 171 and 172 and the lower and upper data terminals DQ0~DQm-1 and DQm~DQ2m-1 may be controlled through selective programming of the fuse arrays 331~335.

Figure 12:
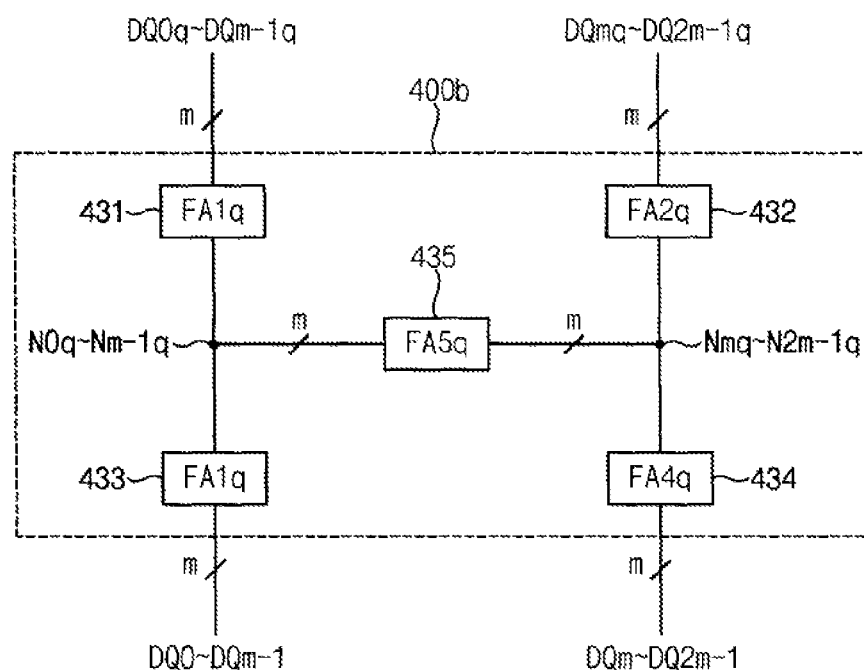
FIG. 12 is a diagram illustrating an example embodiment of a second data path conversion block included in the memory chip of FIG. 10.

FIG. 12 is a diagram illustrating an example embodiment of a second data path conversion block included in the memory chip of FIG. 10.

Referring to FIG. 12, the second data path conversion block 400b may include a first fuse array FA1q 431, a second fuse array FA2q 432, a third fuse array FA3q 433, a fourth fuse array FA4q 434 and a fifth fuse array FA5q 435.

The first fuse array 431 may be coupled between the lower input-output sense amplifier 271 in FIG. 9 and first nodes N0q~Nm-1q. The second fuse array 432 may be coupled between the upper input-output sense amplifier 272 in FIG. 9 and second nodes Nmq~N2m-1q. The third fuse array 433 may be coupled between the first nodes N0q~Nm-1q and the lower data terminals DQ0~DQm-1. The fourth fuse array 434 may be coupled between the second nodes Nmq~N2m-1q and the upper data terminals DQm~DQ2m-1. The fifth fuse array 435 may be coupled between the first nodes N0q~Nm-1q and the second nodes Nmq~N2m-1q.

Each of the fuse arrays 431~435 may include m fuses corresponding to a half of the maximum data width 2m of the memory chip 10b. The connections between the lower and upper input-output sense amplifier 271 and 272 and the lower and upper data terminals DQ0~DQm-1 and DQm~DQ2m-1 may be controlled through selective programming of the fuse arrays 431~435.

Fuses in the fuse arrays 331~335 and 431~435 FIGS. 11 and 12 may be electrical fuses, anti-fuses or a combination of the electrical fuses and the anti-fuses. The electrical fuse may be connected initially and may be programmed or cut electrically by applying a high voltage or a high current. The anti-fuse may be a MOS capacitor that is cut initially and may be programmed or connected electrically by applying a high voltage. The electrical fuse and the anti-fuse are one time programmable (OTP) memory elements that cannot be recovered once they are programmed. The fuses may be programmed based on the location of the activated region before the memory chip is packaged.

Figures 13, 14:
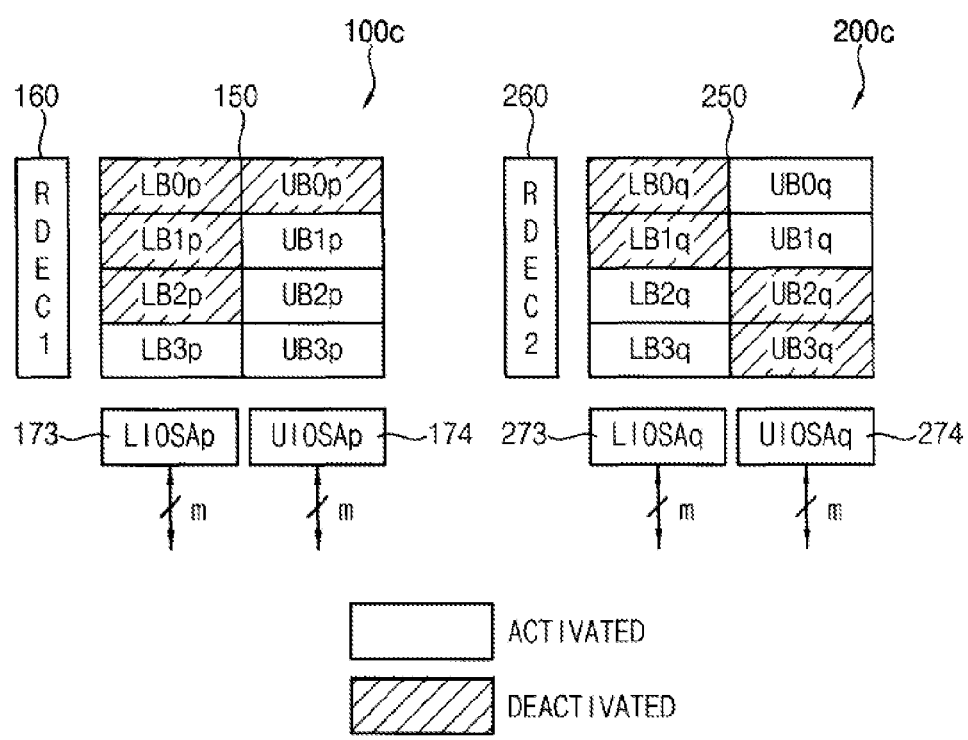
FIG. 13 is a diagram for describing fuse setting of the data path conversion blocks of FIGS. 11 and 12, according to example embodiments.
FIG. 14 is a diagram illustrating an example of activated and deactivated regions of semiconductor dies.

FIG. 13 is a diagram for describing fuse setting of the data path conversion blocks of FIGS. 11 and 12.

Referring to FIGS. 11, 12 and 13, the fuses may be set or programmed depending on whether the semiconductor die is a normal semiconductor die having the full memory capacity or the failed semiconductor die having the half memory capacity.

In the case of the normal semiconductor die having the full memory capacity, the first through fourth fuse arrays FA1p~FA4p and FA1q~FA4q may be electrically connected and the fifth fuse arrays FA5p and FA5q may be cut as shown in FIGS. 11 and 12. Through such fuse setting, the terminals DQ0p~DQm-1p and DQ0q~DQm-1q in the lower input-output sense amplifiers 171 and 271 may be connected to the lower data terminals DQ0~DQm-1 in the die input-output pad units 130 and 230, and the terminals DQmp~DQ2m-1p and DQmq~DQ2m-1q in the upper input-output sense amplifiers 172 and 272 may be connected to the upper data terminals DQm~DQ2m-1 in the die input-output pad units 130 and 230.

In the case of the failed semiconductor die having the half memory capacity, one of the third fuse arrays FA3p and FA3q and the fourth fuse arrays FA4p and FA4q in FIGS. 11 and 12 may be cut selectively. For example, the third fuse array FA3p in the first data path conversion block 300b and the fourth fuse array FA4q in the second data path conversion block 400b may be cut, and the fourth fuse array FA4p in the first data path conversion block 300b and the third fuse array FA3q in the second data path conversion block 400b may be electrically connected. In contrast, as shown in another example, the fourth fuse array FA4p in the first data path conversion block 300b and the third fuse array FA3q in the second data path conversion block 400b may be cut, and the third fuse array FA3p in the first data path conversion block 300b and the fourth fuse array FA4q in the second data path conversion block 400b may be electrically connected.

One of the first arrays FA1p and FA1q and the second fuse arrays FA2p and FA2q may be cut selectively. In the case of the first data path conversion block 300b, one of the first and second fuse array FA1p and FA2p may be cut and the other may be electrically connected according to the location of the activated region in the memory region 150. In the case of the second data path conversion block 400b, one of the first and second fuse array FA1q and FA2q may be cut and the other may be electrically connected according to the location of the activated region in the memory region 250.

In the case of the normal semiconductor dies having the full memory capacity, the fifth fuse arrays FA5p and FA5q may be cut. In the case of the failed semiconductor dies having the half memory capacity, the fifth fuse arrays FA5p and FA5q may be cut selectively depending on cutting of the other fuse arrays.

Through such fuse setting, the data paths may be converted so that only the activated regions may be accessed. The two failed semiconductor dies having the half memory capacity may be address-remapped and then may be packaged to provide a memory chip having the full memory capacity.

FIG. 14 is a diagram illustrating an example of activated and deactivated regions of semiconductor dies.

FIG. 14 illustrates memory regions 150 and 250, row decoders RDEC1 160 and RDEC2 260 and lower input-output sense amplifiers LIOSAp 173 and LIOSAq 273, upper input-output sense amplifiers UIOSAp 174 and UIOSAq 274 included in a first semiconductor die 100c and a second semiconductor die 200c, respectively. In FIG. 14, hashed portions represent the deactivated regions and not-hashed regions represent the activated regions.

Referring to FIG. 14, each of the memory regions 150 and 250 may include a plurality of memory banks Each memory bank has a split-bank structure where each memory bank is divided into a lower sub memory bank LB0p~LB3p and LB0q~LB3q corresponding to a lower input-output sense amplifier 173 and 273 and an upper sub memory bank UB0p~UB3p and UB0q~UB3q corresponding to an upper input-output sense amplifier 174 and 274. In this case, each of the activated region of the first semiconductor die 100c and the activated region of the second semiconductor die 200c corresponds to a half of the lower sub memory banks LB0p~LB3p and LB0q~LB3q and the upper sub memory banks UB0p~UB3p and UB0q~UB3q.

For example, as illustrated in FIG. 14, the four sub memory banks LB0p, LB1p, LB2p, UB0q may correspond to the deactivated region and the other four sub memory banks LB3p, UB1p, UB2p and UB3p may correspond to the activated region in the case of the first semiconductor die 100c and the four sub memory banks LB0q, LB1q, UB2q, UB3q may correspond to the deactivated region and the other four sub memory banks LB2q, LB3q, UB0q and UB1p may correspond to the activated region in the case of the second semiconductor die 200c. As a result, each of the activated region of the first semiconductor die 100c and the activated region of the second semiconductor die 200c may correspond to a half of the full memory capacity of each semiconductor die. As such, the memory chip having the full memory capacity may be implemented using the two failed semiconductor dies 100c and 200c having the half memory capacity.

If the semiconductor dies are normal semiconductor dies that do not include the deactivated regions or the failed regions, each of the semiconductor dies may exchange data with the external device at a maximum data width $2m$ through each input-output sense amplifier. If the memory chip having the full memory capacity is implemented using the two semiconductor dies 100c and 200c, each semiconductor die having the half memory capacity as illustrated in FIG. 14, the two semiconductor die 100c and 200c are accessed simultaneously and the maximum data width $2m$ is divided to the semiconductor dies 100c and 200c. In this case, the die input-output pad unit of the first semiconductor die 100c may exchange data with the chip input-output pad unit 30 at a first half m of a maximum data width $2m$ of the memory chip and the second die input-output pad unit of the second semiconductor die 200c may exchange data with the chip input-output pad unit 30 at a second half m of the maximum data width $2m$ of the memory chip, as described below.

Although FIG. 14 illustrates an example where each memory region includes two memory banks and eight sub memory banks for convenience of illustration, the number of the memory banks and the bank address bit signals is not so limited and may be varied.

Figure 15:
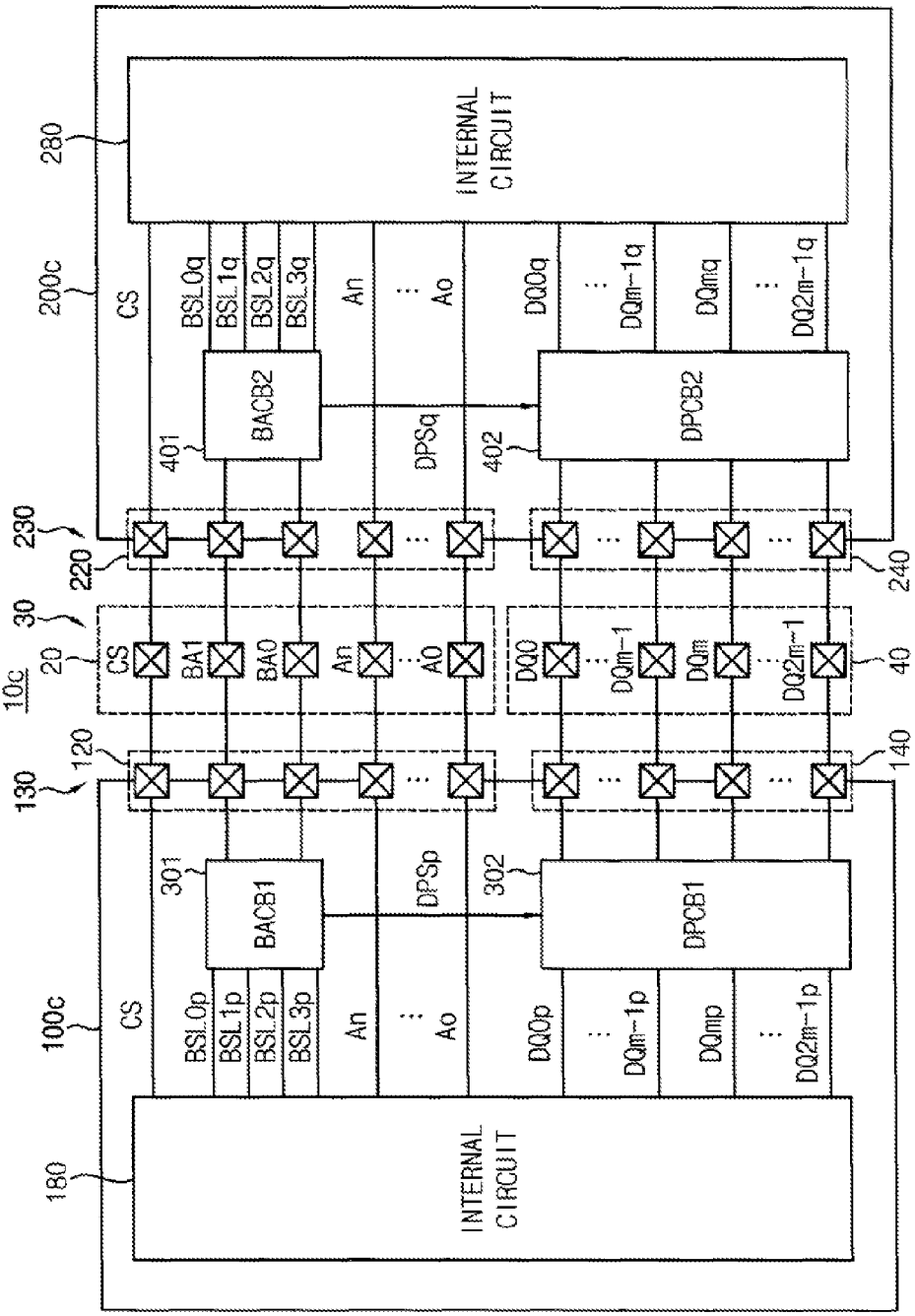
FIG. 15 is a block diagram illustrating a memory chip according to example embodiments.

FIG. 15 is a block diagram illustrating a memory chip according to example embodiments.

Referring to FIG. 15, a memory chip 10c may include a chip input-output pad unit 30, a first semiconductor die 100c and a second semiconductor die 200c. The first semiconductor die 100c may include a first die input-output pad unit 130, a first bank address conversion block BACB1 301, a first data path conversion block DPCB1 302 and a first internal circuit 180. The second semiconductor die 200c may include a second die input-output pad unit 230, a second bank address conversion block BACB2 401, a second data path conversion block DPCB2 402 and a second internal circuit 280. The first bank address conversion block 301, the first data path conversion block 302, the second bank address conversion block 401 and the second data path conversion block 402 correspond to the above mentioned conversion block. The internal circuits 180 and 280 may include the memory regions, the row decoders, and the input-output sense amplifiers respectively.

The chip input-output pad unit 30 may include command-address pins 20 receiving command-address signals CS and A0~An and data pins 40 transferring data signals DQ0~DQ2m-1. The first and second die input-output pad units 130 and 230 may include command-address terminals 120 and 220 connected to the command-address pins 20 and data terminals 140 and 240 connected to the data pins 40 respectively. FIG. 15 illustrates the input-output pins and the corresponding input-output terminals for describing the example embodiment and the other pins and the corresponding terminals are omitted for convenience of illustration.

The bank address conversion blocks 301 and 401 may generate bank select signals BSL0p~BSL3p and BSL0q~BSL3q and data path select signals DPSp and DPSq corresponding to the activated regions based on bank address bit signals BA0 and BA1 that are received through the chip input-output pad unit 30 and the die input-output pad units 130 and 230, respectively.

The first bank address conversion block 301 may generate the first bank select signals BSL0p~BSL3p and the first data path select signal DPSp corresponding to the activated region in the first internal circuit 180 based on the bank address bit signals BA0 and BA1 that are received through the chip input-output pad unit 30 and the first die input-output pad unit 130. The second bank address conversion block 401 may generate the second bank select signals BSL0q~BSL3q and the second data path select signal DPSq corresponding to the activated region in the second internal circuit 280 based on the bank address bit signals BA0 and BA1 that are received through the chip input-output pad unit 30 and the second die input-output pad unit 230.

The first data path conversion block 302 and the second data path conversion block 402 may convert paths between the data signals DQ0~DQ2m-1 on the data pins 40 and first internal data signals DQ0p~DQ2m-1p and second internal data signals DQ0q~DQ2m-1q, respectively. When the semiconductor dies 100c and 200c have the half memory capacity as illustrated in FIG. 14, a half of the first internal data signals DQ0p~DQ2m-1p and a half of the second internal data signals DQ0q~DQ2m-1q correspond to the data signals DQ0~DQ2m-1 on the data pins 40.

The first data path conversion block 302 may, in response to the first data path select signal DPSp, connect one sense amplifier corresponding to the activated region among the lower input-output sense amplifier 173 and the upper input-output sense amplifier 174 in FIG. 14 to one of lower data terminals DQ0~DQm-1 and upper data terminals DQm~DQ2m-1 included in the first die input-output pad unit 130. The second data path conversion block 402 may, in response to the second data path select signal DPSq, connect one sense amplifier corresponding to the activated region among the lower input-output sense amplifier 273 and the upper input-output sense amplifier 274 in FIG. 14 to one of lower data terminals DQ0~DQm-1 and upper data terminals DQm~DQ2m-1 included in the second die input-output pad unit 230.

The first data path conversion block 302 and the second data path conversion block 402 may be connected complementarily to the lower data terminals DQ0~DQm-1 and upper data terminals DQm~DQ2m-1. For example, one conversion block of the first and second data path conversion blocks 302 and 402 may be connected to the lower data terminals DQ0~DQm-1 and the other conversion block may be connected to the upper data terminals DQm~DQ2m-1.

The chip select signal CS and the address bit signals A0~An may be transferred to the internal circuits 180 and 280 without conversion through the address-command terminals 120 and 220.

Figures 16, 17:
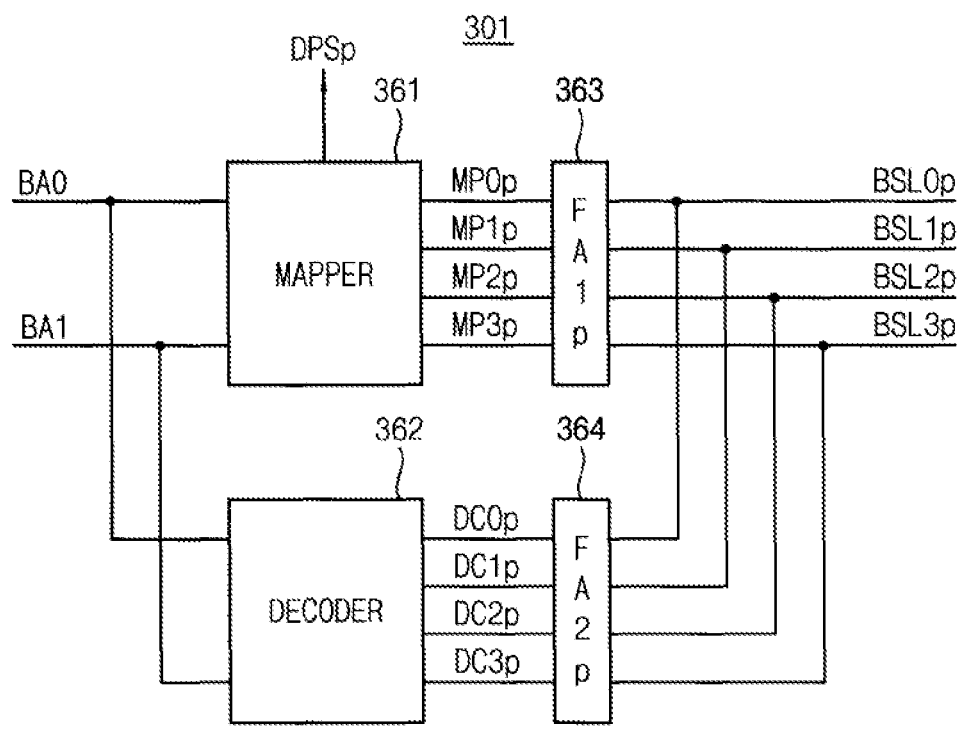
FIG. 16 is a diagram illustrating an example embodiment of a first bank address conversion block included in the memory chip of FIG. 15.
FIG. 17 is a diagram illustrating an operation of the first back address conversion block of FIG. 16, according to example embodiments.

FIG. 16 is a diagram illustrating an example embodiment of a first bank address conversion block included in the memory chip of FIG. 15, and FIG. 17 is a diagram illustrating an operation of the first back address conversion block of FIG. 16.

Referring to FIG. 16, the first bank address conversion block 301 may include a first address mapper 361, a first address decoder 362, a first fuse array FA1$p$ 363 and a second fuse array FA2$p$ 364.

The first address mapper 361 may, based on the bank address bit signals BA0 and BA1, generate first mapping signals MP0$p$~MP3$p$ and a first data path select signal DPSp for accessing the sub memory banks corresponding to the activated region.

The first address decoder 362 may, based on the bank address signals BA0 and BA1, generate first decoded signals DC0$p$~DC3$p$ corresponding to a case of a normal semiconductor die.

The first fuse array 363 and the second fuse array 364 are cut selectively. In the case of the normal semiconductor die having the full memory capacity, the first fuse array 363 may be cut and the second fuse array 364 may be electrically connected to provide the first decoded signals DC0$p$~DC3$p$ as the first bank select signals BSL0$p$~BSL3$p$. In the case of the failed semiconductor die having the half memory capacity, the second fuse array 364 may be cut and the first fuse array 363 may be electrically connected to provide the first mapping signals MP0$p$~MP3$p$ as the first bank select signals BSL0$p$~BSL3$p$.

Referring to FIG. 17, the first decoded signal DC0$p$~DC3$p$ corresponding to the normal semiconductor die may be activated in the logic high level H sequentially one by one according to combinations LL, LH, HL and HH of the bank address bit signals BA0 and BA1. As a result, the memory banks may be selected sequentially one by one. In contrast, the first mapping signals MP0$p$~MP3$p$ corresponding to the failed semiconductor die may have the address-remapped logic levels so that the sub memory banks in the activated region may be selected. The first mapping signals MP0$p$~MP3$p$ in FIG. 17 corresponds to the activated sub memory banks LB3$p$, UB1$p$, UB2$p$ and UB3$p$ in the memory region 150 in FIG. 14. The lower input-output sense amplifier 173 may be selected when the first data path select signal DPSp is in the logic low level L and the upper input-output sense amplifier 174 may be selected when the first data path select signal DPSp is in the logic high level H. As a result, the sub memory banks LB3$p$, UB1$p$, UB2$p$ and UB3$p$ corresponding to the activated region in the memory region 150 may be selected sequentially one by one according to the combination LL, LH, HL and HH of the bank address bit signals BA0 and BA1.

Figure 18:
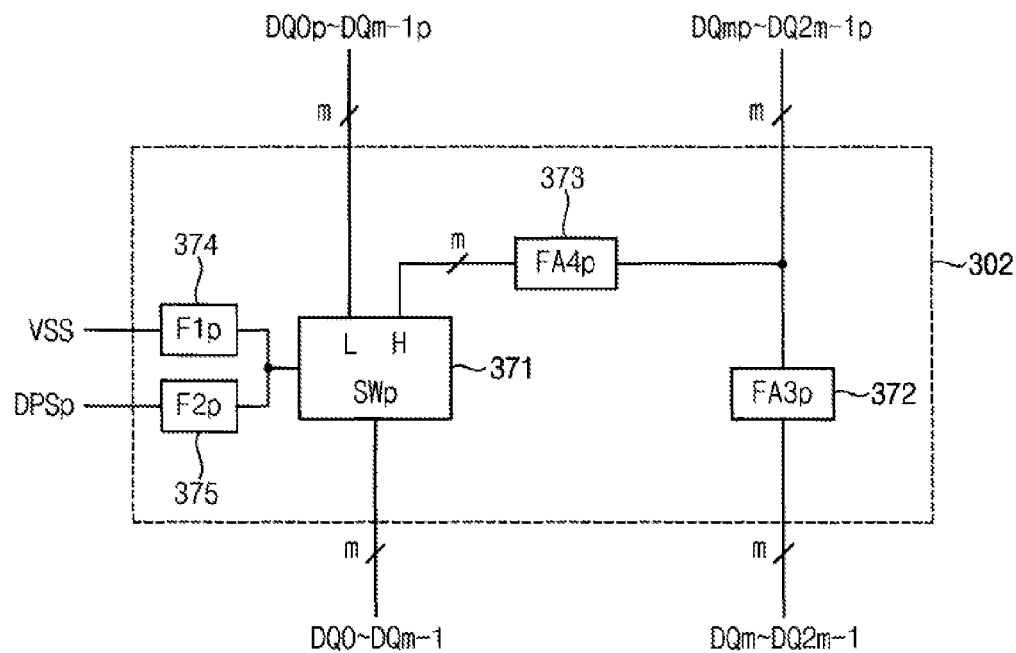
FIG. 18 is a diagram illustrating an example embodiment of a first data path conversion block included in the memory chip of FIG. 15.

FIG. 18 is a diagram illustrating an example embodiment of a first data path conversion block included in the memory chip of FIG. 15.

Referring to FIG. 18, the first data path conversion block 302 may include a first switching circuit SWp 371, a third fuse array FA3$p$ 372, a fourth fuse array FA4$p$ 373, a first fuse F1$p$ 374 and a second fuse F2$p$ 375.

The first switching circuit 371 may connect one of the terminals DQ0$p$~DQm−1$p$ of the lower input-output sense amplifier 173 and the terminals DQm$p$~DQ2$m$−1$p$ of the upper input-output sense amplifier 174 selectively to the lower data terminals DQ0~DQm−1 of the first die input-output pad unit 130. For example, the first switching circuit 371 may be connected to the terminals DQ0$p$~DQm−1$p$ of the lower input-output sense amplifier 173 when a control signal is in the logic low level L, and the first switching circuit 371 may be connected to the terminals DQm$p$~DQ2$m$−1$p$ of the upper input-output sense amplifier 174 when the control signal is in the logic high level H.

In the case of the normal semiconductor die, the first fuse 374 may be electrically connected and the second fuse 375 may be cut. The control signal of the logic low level L corresponding to the ground voltage VSS is provided to the first switching circuit 371 and thus the terminals DQ0$p$~DQm−1$p$ of the lower input-output sense amplifier 173 may be connected to the lower input-output terminals DQ0~DQm−1.

In the case of the failed semiconductor die, the first fuse 374 may be cut and the second fuse 375 may be electrically connected. The first data path select signal DPSp is provided to the first switching circuit 371 as the control signal. As a result, one of the lower terminals DQ0$p$~DQm−1$p$ of the lower input-output sense amplifier 173 and the terminals DQm$p$~DQ2$m$−1$p$ of the upper input-output sense amplifier 174 may be connected selectively to the lower input-output terminals DQ0~DQm−1, according to the above described address remapping.

The third fuse array 372 may be coupled between the terminals DQm$p$~DQ2$m$−1$p$ of the upper input-output sense amplifier 174 and the upper data terminals DQm~DQ2$m$−1, and the fourth fuse array 373 may be coupled between the terminals DQm$p$~DQ2$m$−1$p$ of the upper input-output sense amplifier 174 and the first switching circuit 371. In the case of the normal semiconductor die, the third fuse array 372 may be electrically connected and the fourth fuse array 373 may be cut. Accordingly the terminals DQm$p$~DQ2$m$−1$p$ of the upper input-output sense amplifier 174 may be electrically connected to the upper data terminals DQm~DQ2$m$−1. In contrast, in the case of the failed semiconductor die, the third fuse array 372 may be cut and the fourth fuse array 373 may be electrically connected. Accordingly the terminals DQm$p$~DQ2$m$−1$p$ of the upper input-output sense amplifier 174 may be electrically connected to the first switching circuit 371.

Figure 19:
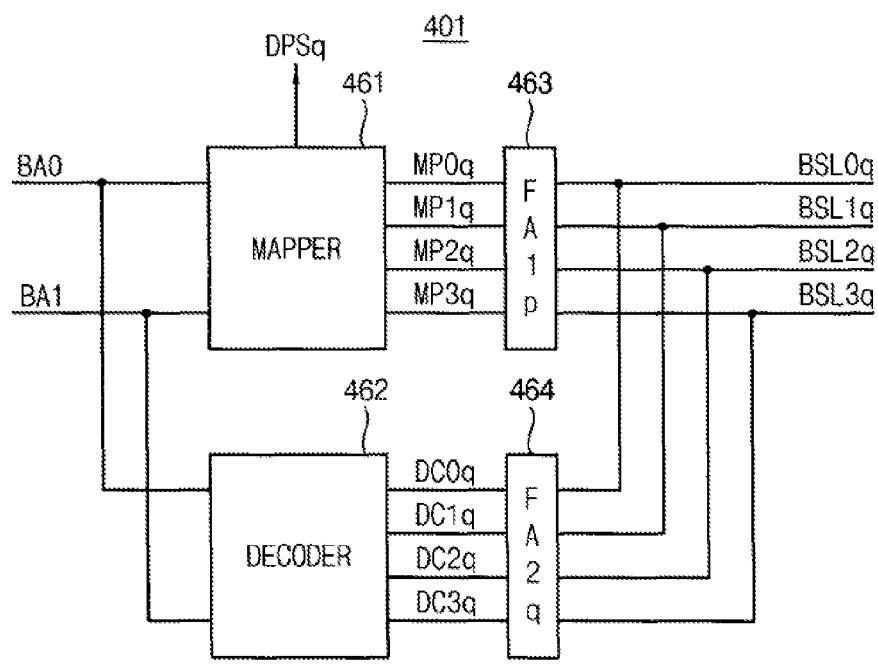
FIG. 19 is a diagram illustrating an example embodiment of a second bank address conversion block included in the memory chip of FIG. 15.
Figures 20, 21:
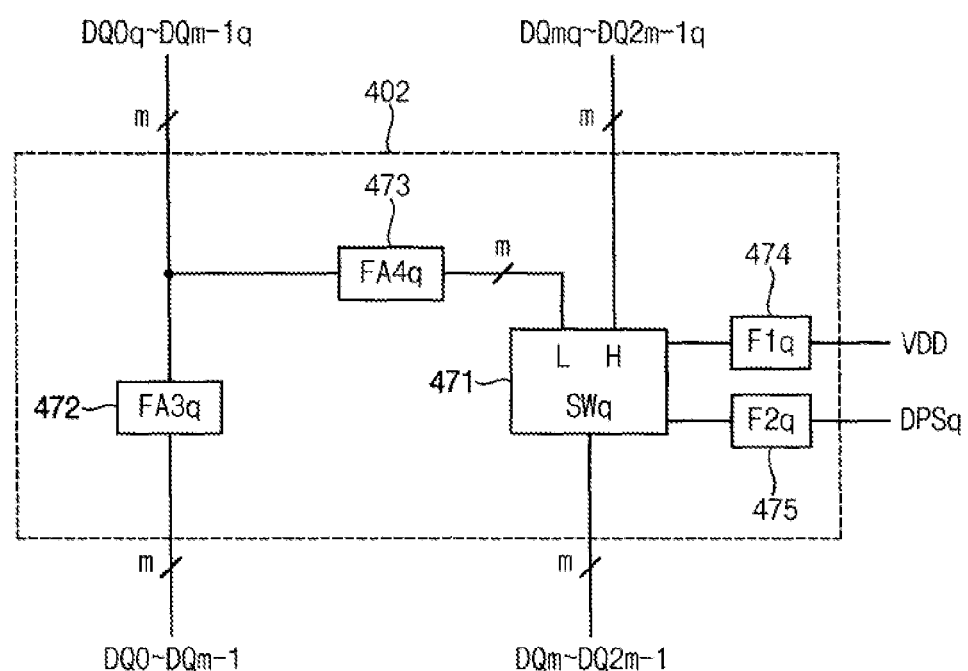
FIG. 20 is a diagram illustrating an operation of the second back address conversion block of FIG. 19, according to example embodiments.
FIG. 21 is a circuit diagram illustrating an example embodiment of a second data path conversion block included in the memory chip of FIG. 15.

FIG. 19 is a diagram illustrating an example embodiment of a second bank address conversion block included in the memory chip of FIG. 15, and FIG. 20 is a diagram illustrating an operation of the second back address conversion block of FIG. 19.

Referring to FIG. 19, the second bank address conversion block 401 may include a second address mapper 461, a second address decoder 462, a first fuse array FA1$q$ 363 and a second fuse array FA2$q$ 464.

The second address mapper 461 may, based on the bank address bit signals BA0 and BA1, generate second mapping signals MP0$q$~MP3$q$ and a second data path select signal DPSq for accessing the sub memory banks corresponding to the activated region.

The second address decoder 462 may, based on the bank address signals BA0 and BA1, generate second decoded signals DC0$q$~DC3$q$ corresponding to a case of a normal semiconductor die.

The first fuse array 463 and the second fuse array 464 are cut selectively. In the case of the normal semiconductor die having the full memory capacity, the first fuse array 463 may be cut and the second fuse array 464 may be electrically connected to provide the second decoded signals DC0$q$~DC3$q$ as the second bank select signals BSL0$q$~BSL3$q$. In the case of the failed semiconductor die having the half memory capacity, the second fuse array 464 may be cut and the first fuse array 463 may be electrically connected to provide the second mapping signals MP0$q$~MP3$q$ as the second bank select signals BSL0$q$~BSL3$q$.

Referring to FIG. 20, the second decoded signal DC0q~DC3q corresponding to the normal semiconductor die may be activated in the logic high level H sequentially one by one according to combinations LL, LH, HL and HH of the bank address bit signals BA0 and BA1. As a result, the memory banks may be selected sequentially one by one. In contrast, the second mapping signals MP0q~MP3q corresponding to the failed semiconductor die may have the address-remapped logic levels so that the sub memory banks in the activated region may be selected. The second mapping signals MP0q~MP3q in FIG. 20 corresponds to the activated sub memory banks LB2q, LB3q, UB0q and UB1q in the memory region 250 in FIG. 14. The lower input-output sense amplifier 273 may be selected when the second data path select signal DPSq is in the logic low level L and the upper input-output sense amplifier 274 may be selected when the second data path select signal DPSq is in the logic high level H. As a result, the sub memory banks LB2q, LB3q, UB0q and UB1q corresponding to the activated region in the memory region 250 may be selected sequentially one by one according to the combination LL, LH, HL and HH of the bank address bit signals BA0 and BA1.

FIG. 21 is a circuit diagram illustrating an example embodiment of a second data path conversion block included in the memory chip of FIG. 15.

Referring to FIG. 21, the second data path conversion block 402 may include a second switching circuit SWq 471, a third fuse array FA3q 472, a fourth fuse array FA4q 473, a first fuse F1q 474 and a second fuse F2q 475.

The second switching circuit 471 may connect one of the terminals DQ0q~DQm−1q of the lower input-output sense amplifier 273 and the terminals DQmq~DQ2m−1q of the upper input-output sense amplifier 274 selectively to the upper data terminals DQm~DQ2m−1 of the second die input-output pad unit 230. For example, the second switching circuit 471 may be connected to the terminals DQ0q~DQm−1q of the lower input-output sense amplifier 273 when a control signal is in the logic low level L, and the second switching circuit 471 may be connected to the terminals DQmq~DQ2m−1q of the upper input-output sense amplifier 274 when the control signal is in the logic high level H.

In the case of the normal semiconductor die, the first fuse 474 may be electrically connected and the second fuse 475 may be cut. The control signal of the logic high level H corresponding to the power supply voltage VDD is provided to the second switching circuit 471 and thus the terminals DQmq~DQ2m−1q of the upper input-output sense amplifier 274 may be connected to the upper input-output terminals DQm~DQ2m−1.

In the case of the failed semiconductor die, the first fuse 474 may be cut and the second fuse 475 may be electrically connected. The second data path select signal DPSq is provided to the second switching circuit 471 as the control signal. As a result, one of the terminals DQ0q~DQm−1 q of the lower input-output sense amplifier 273 and the terminals DQmq~DQ2m−1q of the upper input-output sense amplifier 274 may be connected selectively to the upper input-output terminals DQm~DQ2m−1, according to the above described address remapping.

The third fuse array 472 may be coupled between the terminals DQ0q~DQm−1q of the lower input-output sense amplifier 273 and the lower data terminals DQ0~DQm−1, and the fourth fuse array 473 may be coupled between the terminals DQ0q~DQm−1q of the lower input-output sense amplifier 273 and the second switching circuit 471. In the case of the normal semiconductor die, the third fuse array 472 may be electrically connected and the fourth fuse array 473 may be cut. Accordingly the terminals DQ0q~DQm−1q of the lower input-output sense amplifier 273 may be electrically connected to the lower data terminals DQ0~DQm−1. In contrast, in the case of the failed semiconductor die, the third fuse array 472 may be cut and the fourth fuse array 473 may be electrically connected. Accordingly the terminals DQ0q~DQm−1q of the lower input-output sense amplifier 273 may be electrically connected to the second switching circuit 471.

Figure 22:
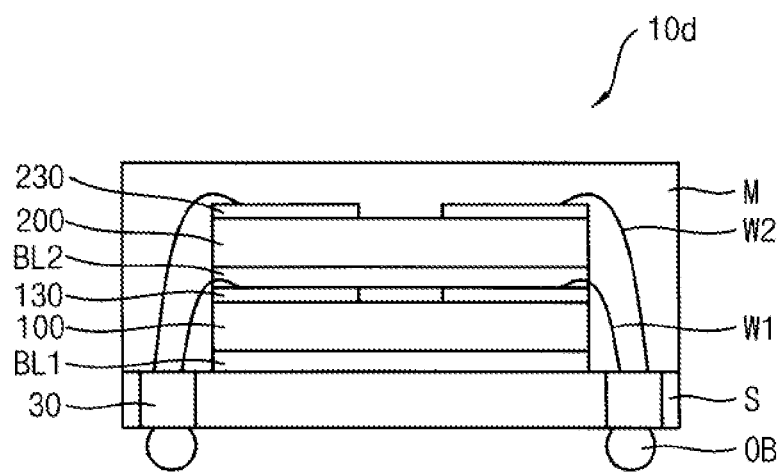
FIG. 22 is a diagram illustrating an example package structure of a memory chip according to example embodiments.

FIG. 22 is a diagram illustrating an example package structure of a memory chip according to example embodiments.

Referring to FIG. 22, a memory chip 10d may include a chip input-output pad unit 30 and semiconductor dies 100 and 200 stacked on a substrate S. The die input-output pad units 130 and 230 of the semiconductor dies 100 and 200 may be connected to the chip input-output pad unit 30 of the substrate S through bonding wires W1 and W2 as illustrated in FIG. 22. In other example embodiments, the die input-output pad units 130 and 230 of the semiconductor dies 100 and 200 and the chip input-output pad unit 30 of the substrate S may be connected by through-silicon vias (TSVs). The semiconductor dies 100 and 200 and the substrate S may be combined using the adhering members BL1 and BL2, and the stacked semiconductor dies 100 and 200 may be packaged using the sealing member M. External connecting members OB, e.g., conductive bumps, may be formed on a lower surface of the substrate S, and the semiconductor dies 100 and 200 may be electrically connected to the external device via the external connecting members OB.

Figure 23:
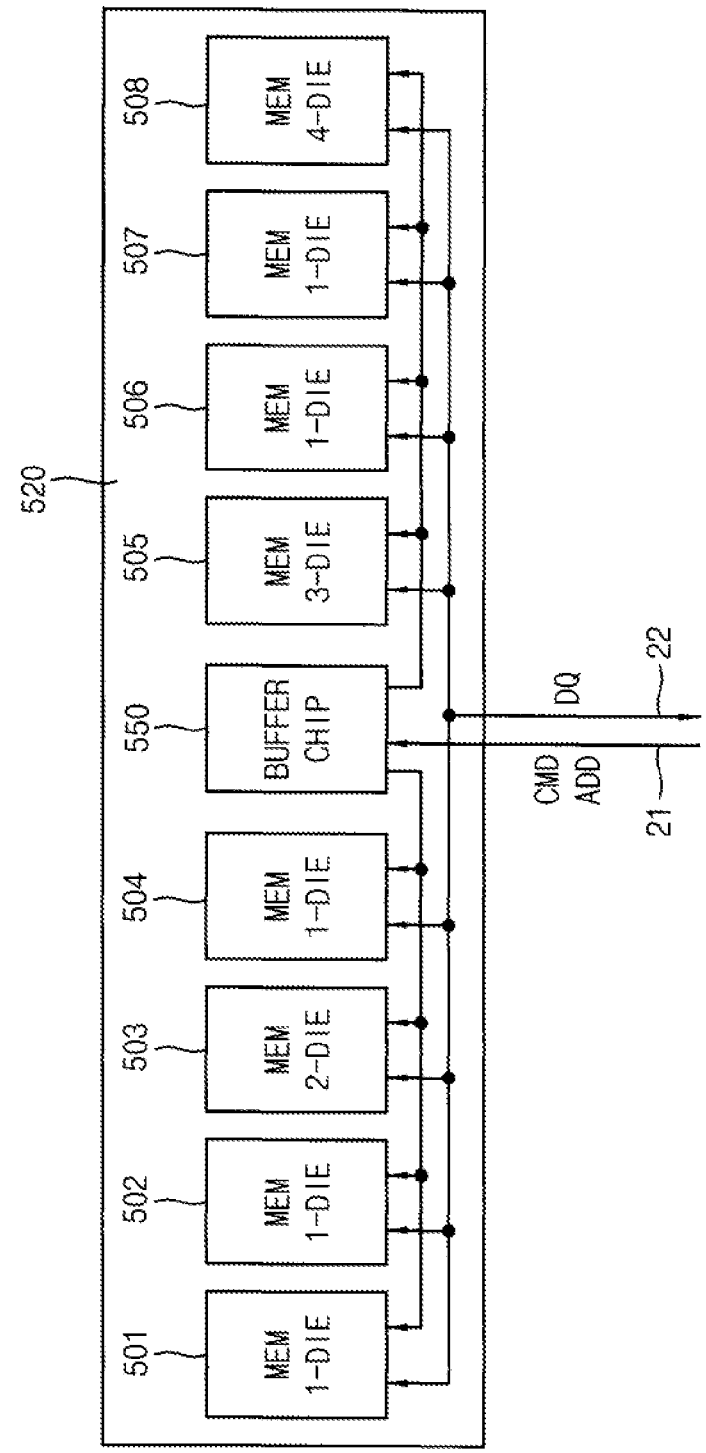
FIG. 23 is a block diagram illustrating a memory module according to example embodiments.

FIG. 23 is a block diagram illustrating a memory module according to example embodiments.

Referring to FIG. 23, a memory module 500 may include a plurality of memory chips 501~508 mounted on a module board 520 and a buffer chip 550. The memory module 500 may be implemented with a registered dual in-line memory module (RDIMM).

Each of the memory chips 501~508 may receive data DQ from an external device such as a memory controller through a data bus 22 in a write mode, or transmit the data DQ to the external device through the data bus 22 in a read mode.

The buffer chip 505 may receive command signals CMD and address signals ADD through a control bus 21 to provide the received signals CMD and ADD to the memory chips 501~505.

At least one of the memory chips 505~505 may be a memory chip that includes a plurality of address-remapped semiconductor dies or failed semiconductor dies according to example embodiments. For example, the memory module 500 may include the memory chip 503 including two failed semiconductor dies, the memory chip 505 including three failed semiconductor dies and the memory chip 508 including four failed semiconductor dies, as illustrated in FIG. 23. Each of the other memory chips 501, 502, 504, 506 and 507 may include one normal semiconductor die.

As such, the memory chip according to example embodiment may enhance productivity by reusing incurable semiconductor dies. The incurable semiconductor dies may be stacked to have the same memory capacity as a full memory capacity of a normal semiconductor die and thus productivity may be enhanced without increasing sizes of a memory chip, a memory module and a memory system including the memory chip.

Figure 24:
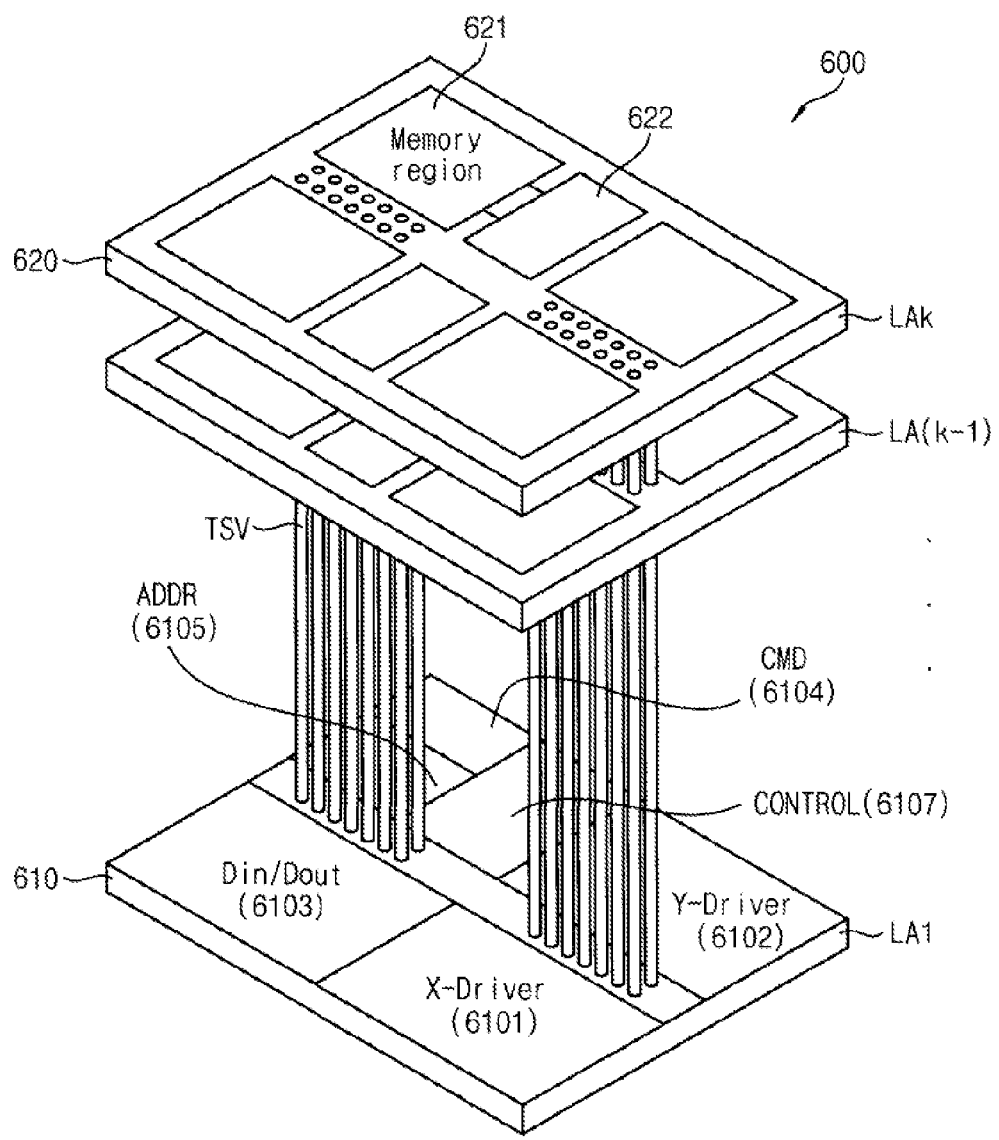
FIG. 24 is a structural diagram illustrating a semiconductor memory device according to example embodiments.

FIG. 24 is a structural diagram illustrating a semiconductor memory device according to example embodiments.

Referring to FIG. 24, a semiconductor memory device 600 may include first through nth semiconductor integrated circuit layers LA1 through LAn, in which the lowest first semiconductor integrated circuit layer LA1 is assumed to be a master layer and the other semiconductor integrated circuit layers LA2 through LAn are assumed to be slave layers. A portion of the slave layers LA2 through LAn may be address-remapped failed semiconductor dies according to example embodiments, and a plurality of failed semiconductor dies may operate as one slave layer.

The first through nth semiconductor integrated circuit layers LA1 through LAn may transmit and receive signals by through-silicon-vias (TSVs). The master layer LA1 as the interface or control layer may communicate with an external memory controller through a conductive structure (not shown) formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAn or 620 as the slave chip.

The first semiconductor integrated circuit layer 610 may include various peripheral circuits for driving memory regions 621 provided in the nth semiconductor integrated circuit layer 620. For example, the first semiconductor integrated circuit layer 610 may include a row (X)-driver 6101 for driving word-lines of a memory, a column (Y)-driver 6102 for driving bit lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address.

The first semiconductor integrated circuit layer 610 may further include a control logic 6107. The control logic 6107 may control an access to the memory region 621 based on a command and an address signal from a memory controller.

The nth semiconductor integrated circuit layer 620 may include the memory regions 621 including memory cell arrays and peripheral circuit regions 622 in which peripheral circuits for reading/writing data of the memory regions 621, e.g., a row decoder, a column decoder, a bit line sense amplifier, etc. (not illustrated) are arranged.

Figure 25:
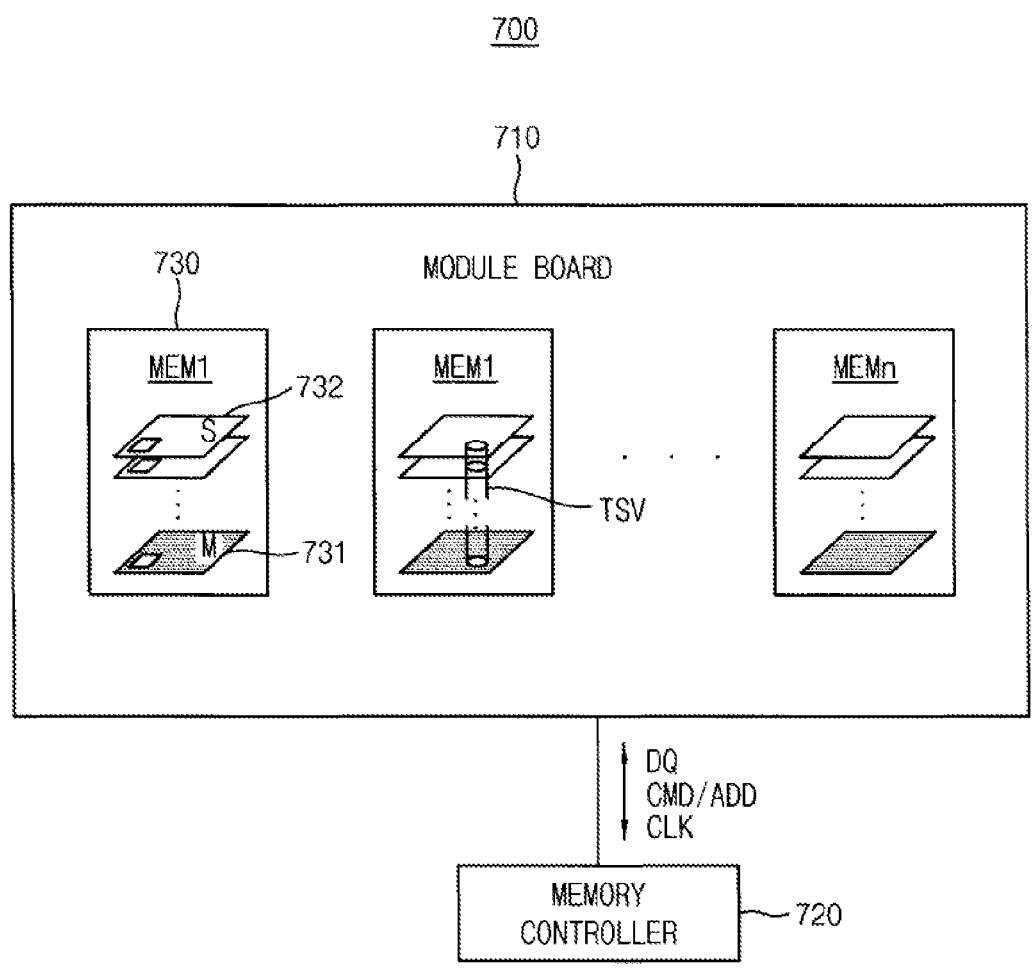
FIG. 25 is a block diagram illustrating a memory system including a semiconductor memory device according to example embodiments.

FIG. 25 is a block diagram illustrating a memory system including a semiconductor memory device according to example embodiments.

Referring to FIG. 25, a memory system 700 may include a memory module 710 and a memory controller 720. The memory module 710 may include a plurality of semiconductor memory devices or memory chips MEM1~MEMn mounted on a module board. At least one of the semiconductor memory devices MEM1~MEMn may include address-remapped failed semiconductor dies according to example embodiments. Each semiconductor memory device 730 may include a stack of semiconductor dies. In this case, the semiconductor dies may include at least one master die 731 and at least one slave die 732. Signal transfer between the semiconductor dies may occur via through-silicon vias TSV.

The memory module 710 may communicate with the memory controller 720 via a system bus. Data DQ, a command/address CMD/ADD, and a clock signal CLK may be transmitted and received between the memory module 710 and the memory controller 720 via the system bus.

Figure 26:
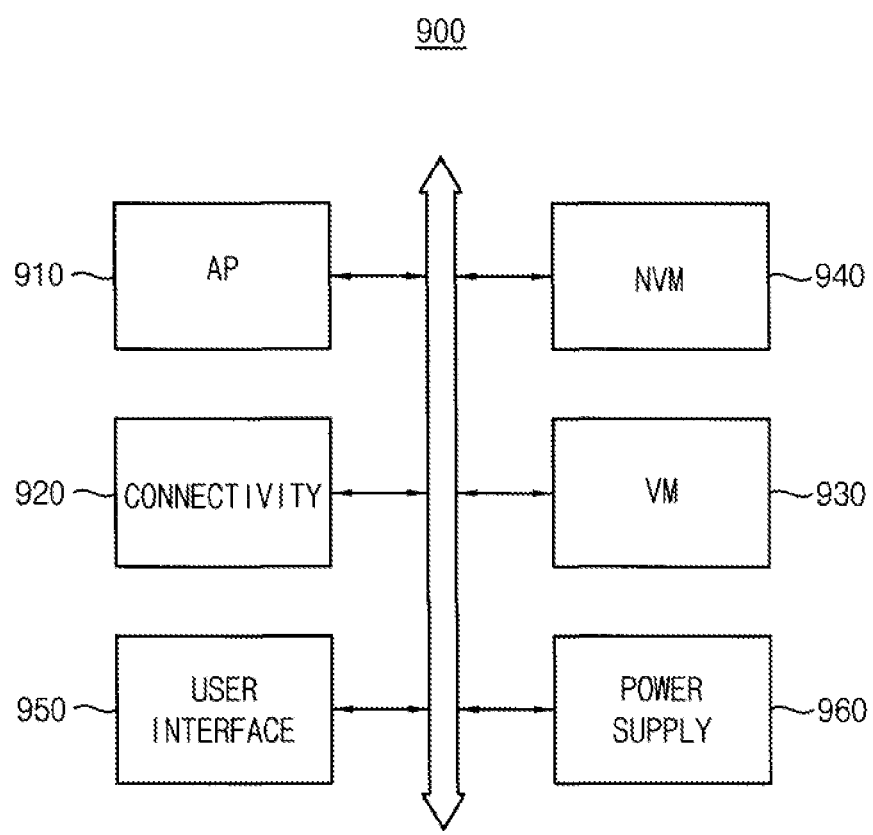
FIG. 26 is a block diagram illustrating a mobile system including a semiconductor memory device according to example embodiments.

FIG. 26 is a block diagram illustrating a mobile system including a semiconductor memory device according to example embodiments.

Referring to FIG. 26, a mobile system 900 may include an application processor 910, a connectivity unit 920, a semiconductor memory device 950, a nonvolatile memory device 940, a user interface 930 and a power supply 960. In some embodiments, the mobile system 900 may be a mobile phone, a smart phone, a personal digital assistant (PDA), a portable multimedia player (PMP), a digital camera, a music player, a portable game console, a navigation system, etc.

The application processor 910 may execute applications, such as a web browser, a game application, a video player, etc. In some embodiments, the application processor 910 may include a single core or multiple cores. For example, the application processor 910 may be a multi-core processor, such as a dual-core processor, a quad-core processor, a hexa-core processor, etc. The application processor 910 may include an internal or external cache memory.

The connectivity unit 920 may perform wired or wireless communication with an external device. For example, the connectivity unit 920 may perform Ethernet communication, near field communication (NFC), radio frequency identification (RFID) communication, mobile telecommunication, memory card communication, universal serial bus (USB) communication, etc. In some embodiments, the connectivity unit 920 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device VM 930 may store data processed by the application processor 910 or operate as a working memory. The volatile memory device 930 may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc.

The nonvolatile memory device NVM 940 may store a boot image for booting the mobile system 900. For example, the nonvolatile memory device 940 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The volatile memory device 930 and/or the nonvolatile memory device 940 may include at least one memory chip that is implemented with address-remapped failed semiconductor dies according to example embodiments.

The user interface 930 may include at least one input device, such as a keypad, a touch screen, etc., and at least one output device, such as a speaker, a display device, etc. The power supply 960 may supply a power supply voltage to the mobile system 900. In some embodiments, the mobile system 900 may further include a camera image processor (CIS), and/or a storage device, such as a memory card, a solid state drive (SSD), a hard disk drive (HDD), a CD-ROM, etc.

In some embodiments, the mobile system 900 and/or components of the mobile system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), or wafer-level processed stack package (WSP).

Figure 27:
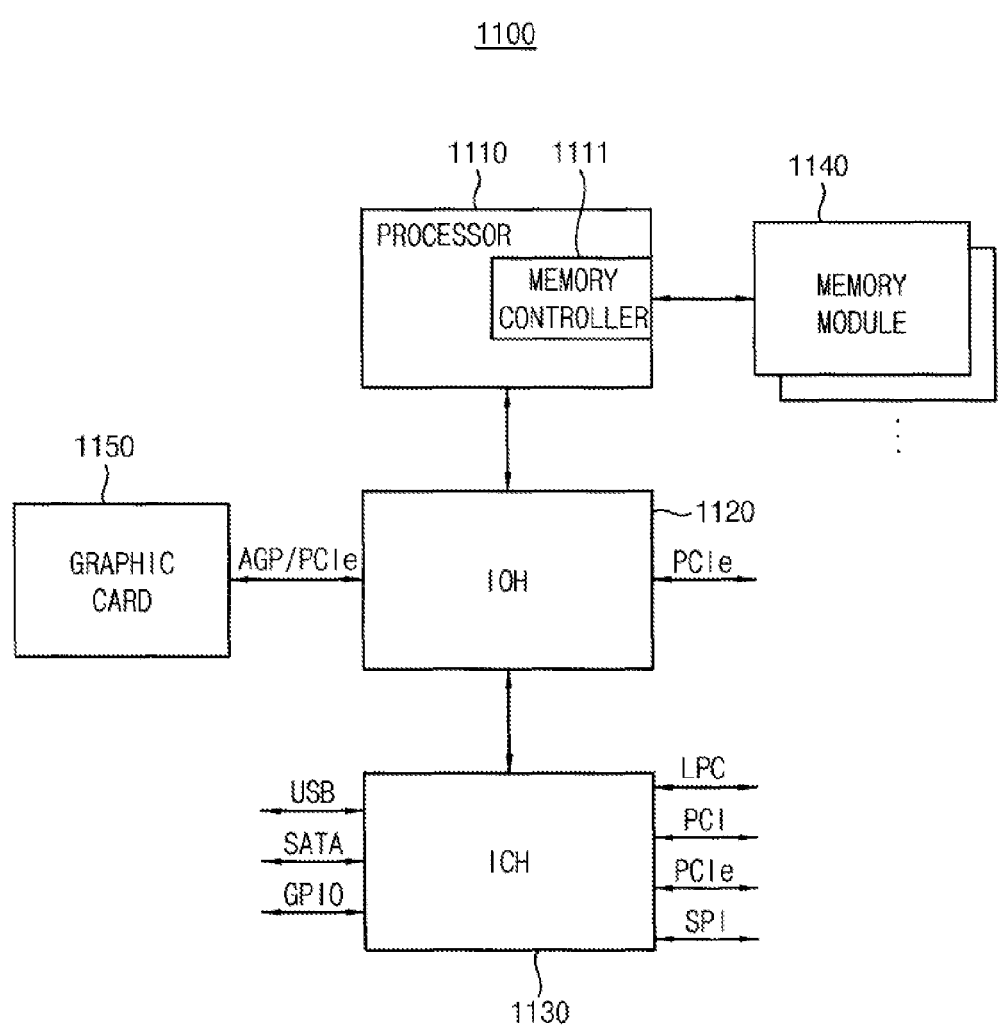
FIG. 27 is a block diagram illustrating a computing system including a semiconductor memory device according to example embodiments.

FIG. 27 is a block diagram illustrating a computing system including a semiconductor memory device according to example embodiments.

Referring to FIG. 27, a computing system 1100 may include a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 21 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 may be located inside the input/output hub 1120, which may be referred to as a memory controller hub (MCH).

The memory module 1140 may include a plurality of semiconductor memory devices or memory chips that store data provided from the memory controller 1111. At least one of the memory chips may be implemented with address-remapped failed semiconductor dies according to example embodiments.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a Quick-Path interconnect (QPI), a common system interface (CSI), etc. Although FIG. 27 illustrates the computing system 1100 including one input/output hub 1120, in some embodiments, the computing system 1100 may include a plurality of input/output hubs.

The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. In some embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

As mentioned above, the memory chip according to example embodiment may enhance productivity by reusing incurable semiconductor dies. The incurable semiconductor dies may be stacked to have the same memory capacity as a full memory capacity of a normal semiconductor die and thus productivity may be enhanced without increasing sizes of a memory chip, a memory module and a memory system including the memory chip.

The present disclosure may be applied to various devices and systems including a memory chip. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the inventive concept. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory chip comprising:
    a chip input-output pad unit including a plurality of input-output pins connected to an external device; and
    a plurality of semiconductor dies connected to the chip input-output pad unit, each semiconductor die comprising:
        a die input-output pad unit including a plurality of input-output terminals respectively connected to the input-output pins of the chip input-output pad unit;
        a memory region including an activated region corresponding to a portion of a full memory capacity of each semiconductor die and a deactivated region corresponding to a remainder portion of the full memory capacity; and
        a conversion block configured to connect the activated region, except the deactivated region, to the die input-output pad unit, wherein the conversion block includes:
            an address conversion block configured to generate an internal chip select signal and an internal most significant address bit signal corresponding to the activated region based on a chip select signal and a most significant address bit signal that are received through the chip input-output pad unit and the die input-output pad unit, and
            wherein the address conversion block is configured to remap the chip select signal and the most significant address bit signal to the internal chip select signal and the internal most significant address bit signal with at least one programmed fuse in the address conversion block.

2. The memory chip of claim 1, wherein the conversion block includes a plurality of fuses and the plurality of fuses are programmed based on a location of the activated region before the memory chip is packaged.

3. The memory chip of claim 1, wherein a sum of memory capacities of the activated regions of the plurality of the semiconductor dies is equal to the full memory capacity of each semiconductor die.

4. The memory chip of claim 1, wherein the plurality of semiconductor dies include a first semiconductor die and a second semiconductor die that are stacked vertically and packaged together.

5. The memory chip of claim 4, wherein each of the activated region of the first semiconductor die and the activated region of the second semiconductor die is one of a first region corresponding to a logic high level of a most significant address bit signal and a second region corresponding to a logic low level of the most significant address bit signal.

6. The memory chip of claim 5, wherein, when the chip select signal is activated, one of the internal chip select signal of the first semiconductor die and the internal chip select signal of the second semiconductor die is activated selectively depending on the logic high level or the logic low level of the most significant address bit signal.

7. The memory chip of claim 5, wherein each of the internal most significant address bit signal of the first semiconductor die and the internal most significant address bit signal of the second semiconductor die is fixed to the logic high level or the logic low level depending on each location of each activated region regardless of the logic level of the most significant address bit signal.

8. The memory chip of claim 5, wherein the address conversion block includes:
    a logic gate configured to perform the logic operation on the chip select signal and the most significant address bit signal; and wherein
    the at least one fuse circuitry is configured to output one of the chip select signal and an output of the logic gate as the internal chip select signal and is configured to output one of the most significant address bit signal and a signal having a fixed logic level as the internal most significant address bit signal.

9. The memory chip of claim 5, wherein one of the die input-output pad unit of the first semiconductor die and the die input-output pad unit of the second semiconductor die exchanges data with the chip input-output pad unit with data width of the memory chip.

10. The memory chip of claim 4, wherein each memory capacity of the activated region of the first semiconductor die and the activated region of the second semiconductor die is equal to a half of the full memory capacity of each semiconductor die.

11. The memory chip of claim 4, wherein each of the activated region of the first semiconductor die and the activated region of the second semiconductor die is one of a first region corresponding to a lower input-output sense amplifier and a second region corresponding to an upper input-output sense amplifier.

12. The memory chip of claim 11, wherein the conversion block includes:
    a data path conversion block configured to connect one sense amplifier corresponding to the activated region among the lower input-output sense amplifier and the upper input-output sense amplifier to one of lower data terminals and upper data terminals included in the die input-output pad unit.

13. The memory chip of claim 12, wherein the data path conversion block includes:
    a first fuse array coupled between the lower input-output sense amplifier and first nodes;
    a second fuse array coupled between the upper input-output sense amplifier and second nodes;
    a third fuse array coupled between the first nodes and the lower data terminals;
    a fourth fuse array coupled between the second nodes and the upper data terminals; and
    a fifth fuse array coupled between the first nodes and the second nodes.

14. The memory chip of claim 13, wherein one of the first fuse array and the second fuse array is cut selectively, and one of the third fuse array and the fourth fuse array is cut selectively.

15. The memory chip of claim 11, wherein the die input-output pad unit of the first semiconductor die exchanges data with the chip input-output pad unit at a first half of a maximum data width of the memory chip and the die input-output pad unit of the second semiconductor die exchanges data with the chip input-output pad unit at a second half of the maximum data width of the memory chip.

16. The memory chip of claim 4, wherein the memory region includes a plurality of memory banks and each memory bank has a split-bank structure such that each memory bank is divided into a lower sub memory bank corresponding to a lower input-output sense amplifier and an upper sub memory bank corresponding to an upper input-output sense amplifier, and
    wherein each of the activated region of the first semiconductor die and the activated region of the second semiconductor die corresponds to a half of the lower sub memory banks and the upper sub memory banks.

17. The memory chip of claim 16, wherein the conversion block includes:
- a bank address conversion block configured to generate bank select signals and a data path select signal corresponding to the activated region based on at least one bank address bit signal that is received through the chip input-output pad unit and the die input-output pad unit; and
- a data path conversion block configured to connect one sense amplifier corresponding to the activated region among the lower input-output sense amplifier and the upper input-output sense amplifier to one of lower data terminals and upper data terminals included in the die input-output pad unit, in response to the data path select signal.

18. A memory module comprising:
a module board; and
a plurality of memory chips mounted on the module board, at least one of the plurality of memory chips comprising:
- a chip input-output pad unit including a plurality of input-output pins connected to an external device; and
- a plurality of semiconductor dies connected to the chip input-output pad unit and having a full memory capacity respectively, each semiconductor die comprising:
  - a die input-output pad unit including a plurality of input-output terminals respectively connected to the input-output pins of the chip input-output pad unit;
  - a memory region including an activated region corresponding to a portion of the full memory capacity and a deactivated region corresponding to a remainder portion of the full memory capacity; and
  - a conversion block configured to connect the activated region, except the deactivated region, to the die input-output pad unit, wherein the conversion block includes:
    an address conversion block configured to generate an internal most significant address bit signal corresponding to the activated region based on a most significant address bit signal that is received through the chip input-output pad unit and the die input-output pad unit, and
    wherein the address conversion block is configured to remap the most significant address bit signal to the internal most significant address bit signal by performing a logic operation on the most significant address bit signal and by using at least one programmed fuse in the address conversion block.

19. The memory module of claim 18, wherein the address conversion block is configured to:
generate an internal chip select signal corresponding to the activated region based on a chip select signal that is received through the chip input-output pad unit and the die input-output pad unit, and
remap the chip select signal to the internal chip select signal by performing a logic operation on the chip select signal and by using at least one programmed fuse in the address conversion block.

20. A memory system comprising:
a memory controller; and
at least one memory chip connected to the memory controller, the at least one memory chip comprising:
- a chip input-output pad unit including a plurality of input-output pins connected to an external device; and
- a plurality of semiconductor dies connected commonly to the chip input-output pad unit and having a full memory capacity respectively, each semiconductor die comprising:
  - a die input-output pad unit including a plurality of input-output terminals respectively connected to the input-output pins of the chip input-output pad unit;
  - a memory region including an activated region corresponding to a portion of the full memory capacity and a deactivated region corresponding to a remainder portion of the full memory capacity; and
  - a conversion block configured to connect the activated region, except the deactivated region, to the die input-output pad unit, wherein the conversion block includes:
    an address conversion block configured to generate an internal chip select signal and an internal most significant address bit signal corresponding to the activated region based on a chip select signal and the most significant address bit signal that are received through the chip input-output pad unit and the die input-output pad unit, and
    wherein the address conversion block is configured to remap the chip select signal and the most significant address bit signal to the internal chip select signal and the internal most significant address bit signal with at least one programmed fuse in the address conversion block.

* * * * *